(12) United States Patent
Akiyama et al.

(10) Patent No.: US 7,656,736 B2
(45) Date of Patent: Feb. 2, 2010

(54) SEMICONDUCTOR DEVICE INCLUDING INTERNAL VOLTAGE GENERATION CIRCUIT

(75) Inventors: Mihoko Akiyama, Itami (JP); Futoshi Igaue, Itami (JP); Kenji Yoshinaga, Itami (JP); Masashi Matsumura, Itami (JP); Fukashi Morishita, Chiyoda-ku (JP)

(73) Assignee: Renesas Technology Corp., Tokyo (JP)

( * ) Notice: Subject to any disclaimer, the term of this patent is extended or adjusted under 35 U.S.C. 154(b) by 412 days.

(21) Appl. No.: 11/717,717

(22) Filed: Mar. 14, 2007

(65) Prior Publication Data

US 2007/0216467 A1    Sep. 20, 2007

(30) Foreign Application Priority Data

Mar. 14, 2006   (JP)   ............................. 2006-069086

(51) Int. Cl.
  *G11C 5/14*   (2006.01)
(52) U.S. Cl. ........................ 365/226; 365/227; 365/229; 365/185.18; 365/185.27; 365/210.12; 327/534; 327/536

(58) Field of Classification Search ................. 365/226, 365/227, 229, 185.18, 185.27, 210.12; 327/534, 327/536
See application file for complete search history.

(56) References Cited

U.S. PATENT DOCUMENTS

| | | | |
|---|---|---|---|
| 6,297,671 B1 * | 10/2001 | Shih et al. | ...................... 327/74 |
| 6,313,695 B1 * | 11/2001 | Ooishi et al. | ................. 327/544 |
| 6,414,881 B1 * | 7/2002 | Fujii et al. | ............. 365/189.09 |

\* cited by examiner

*Primary Examiner*—Van Thu Nguyen
*Assistant Examiner*—Eric Wendler
(74) *Attorney, Agent, or Firm*—McDermott Will & Emery LLP

(57) ABSTRACT

A semiconductor integrated circuit device has a negative voltage generation circuit provided at each power supply circuit unit for six memory macros. Therefore, the response with respect to variation in a negative voltage is increased. In a standby mode, a negative voltage supply line for the six memory macros is connected by a switch circuit, and only a negative voltage generation circuit of one power supply circuit unit among six negative voltage generation circuits of the six power supply circuit units is rendered active. Thus, increase in standby current can be prevented.

3 Claims, 19 Drawing Sheets

SEMICONDUCTOR DEVICE INCLUDING INTERNAL VOLTAGE GENERATION CIRCUIT

BACKGROUND OF THE INVENTION

1. Field of the Invention

The present invention relates to semiconductor devices, particularly a semiconductor device including an internal voltage generation circuit.

2. Description of the Background Art

In a general DRAM (Dynamic Random Access Memory), an N channel MOS transistor is used as a transfer gate of a memory cell. A positive voltage is employed as the voltage for selection, applied to a word line, when a memory cell is rendered active. A negative voltage generation circuit generating a negative voltage lower than the ground voltage is incorporated in this DRAM. The negative voltage is used as a substrate bias voltage to control the substrate effect of a transistor.

In this context, variation in the level of the negative voltage is suppressed due to the large capacitance of the substrate. Further, high-speed response at the negative voltage generation circuit formed of a negative voltage detection circuit and a negative charge supply circuit is not required. Since high-speed response at the negative voltage generation circuit is not required even for a chip that incorporates a plurality of memories, only one negative voltage generation circuit having a performance level just required to charge the substrate when the external power supply is turned on is disposed at one site.

In a DRAM using a P channel MOS transistor as the transfer gate of a memory cell, a negative voltage is used as the voltage for selection, applied to a word line, when a memory cell is rendered active. In this type of DRAM, it is required to write a signal of ground level into a memory cell in a write operation mode, and output a signal voltage of sufficient amplitude from a memory cell in a readout operation mode. Therefore, the voltage to select a word line must be set sufficiently low.

In this context, high-speed response at the negative voltage generation circuit is required since the substrate capacitance is not large as in a conventional DRAM and the current consumption related to negative voltage is increased. Thus, there is a problem that variation in the negative voltage becomes great in a chip that has one negative voltage generation circuit incorporated for a plurality of memories.

A possible consideration is to increase the through current (standby current) flowing to the negative voltage detection circuit in the negative voltage generation circuit to allow higher speed in response. However, the standby current cannot be increased in the field of battery-driven portable equipment in which this type of DRAM is incorporated, since there is a demand for lower power consumption by reduction in operating voltage and consumed current.

This type of DRAM also poses the problem of increase in circuit failure caused by excessive stress applied to the transistor during a burn-in test mode.

Further, this type of DRAM poses the problem that the operation speed is reduced due to the reduction in power supply voltage and/or increase in ground voltage in a circuit operation mode.

In addition, this type of DRAM is easily affected by noise.

Moreover, there was a problem that a semiconductor integrated circuit device including a plurality of such DRAMs exhibited unstable circuit operation due to the reduction in power supply voltage and/or increase in ground voltage.

SUMMARY OF THE INVENTION

In view of the foregoing, a main object of the present invention is to provide a semiconductor device that allows high-speed operation with low standby current.

Another object of the present invention is to provide a semiconductor device that can prevent application of excessive stress in a burn-in test mode.

A further object of the present invention is to provide a semiconductor device having high operation speed.

Still another object of the present invention is to provide a semiconductor device highly immune to noise.

A still further object of the present invention is to provide a semiconductor device with small reduction in power supply voltage and increase in ground voltage.

A semiconductor device according to the present invention includes a plurality of negative voltage supply lines connected in common; a plurality of negative voltage detection circuits provided corresponding to the plurality of negative voltage supply lines, respectively, each providing a first activation signal when a voltage of a corresponding negative voltage supply line is higher than a predetermined negative voltage; a plurality of negative charge supply circuits provided corresponding to the plurality of negative voltage supply lines, respectively, each supplying negative charge to a corresponding negative voltage supply line when the first activation signal is output from a corresponding negative voltage detection circuit; a plurality of memory circuits provided corresponding to the plurality of negative voltage supply lines, respectively, each receiving a negative voltage from a corresponding negative voltage supply line, and allowing a data write/read operation independently; and a control circuit rendering active a first number of negative voltage detection circuits among the plurality of negative voltage detection circuits in an active mode, and rendering a second number of negative voltage detection circuits, lower in number than the first number, active in a standby mode. Therefore, reduction in current consumption in a standby mode and increase in the operation speed in an active mode can be facilitated.

A semiconductor device according to another aspect of the present invention includes a plurality of negative voltage supply lines; a plurality of negative voltage generation circuits provided corresponding to the plurality of negative voltage supply lines, respectively, each rendered active in a normal operation mode to maintain a corresponding negative voltage supply line at a predetermined negative voltage, and rendered inactive in a burn-in test mode; a voltage switch circuit provided common to the plurality of negative voltage supply lines to provide a ground voltage to a plurality of negative voltage supply lines in a burn-in test mode; and a plurality of memory circuits provided corresponding to the plurality of negative voltage supply lines, respectively, each receiving the negative voltage and the ground voltage from a corresponding negative voltage supply line. Thus, application of excessive stress in the burn-in test mode can be prevented.

A semiconductor device according to a further aspect of the present invention includes a reference voltage generation circuit generating a reference voltage; a reference voltage line receiving the reference voltage generated at the reference voltage generation circuit; a shield line provided along the reference voltage line; a power supply voltage line receiving power supply voltage; a stabilization capacitor having one electrode connected to the reference voltage line and the other electrode receiving the power supply voltage from the power supply voltage line; a negative voltage generation circuit driven by the power supply voltage from the power supply voltage line, and receiving the reference voltage from the reference voltage line to generate a negative voltage based on the received reference voltage; and an internal circuit driven by the power supply voltage from the power supply voltage line and the negative voltage generated at the negative voltage generation circuit. Since the negative voltage is reduced as the power supply voltage is reduced, the voltage applied to the internal circuit will not change. Accordingly, the operation speed will not vary.

A semiconductor device according to still another aspect of the present invention includes a reference voltage generation circuit generating a reference voltage; a reference voltage line receiving the reference voltage generated at the reference voltage generation circuit; a shield line provided along the reference voltage line; a ground voltage line receiving a ground voltage; a stabilization capacitor having one electrode connected to the reference voltage line and the other electrode receiving the ground voltage from the ground voltage line; an internal voltage generation circuit driven by the power supply voltage and the ground voltage from the ground voltage line, and receiving the reference voltage from the reference voltage line to generate an internal voltage based on the received reference voltage; and an internal circuit driven by the internal voltage generated at the internal voltage generation circuit and the ground voltage from the ground voltage line. Since the internal voltage rises as the ground voltage rises, the voltage applied to the internal circuit does not change. Therefore, the operation speed will not vary.

A semiconductor device according to a still further aspect of the present invention includes a reference voltage generation circuit generating a reference voltage; a reference voltage line receiving the reference voltage generated at the reference voltage generation circuit; a shield line provided along the reference voltage line, and receiving a ground voltage; an internal voltage generation circuit receiving the reference voltage from the reference voltage line to generate an internal voltage based on the received reference voltage; and an internal circuit driven by the internal voltage generated at the internal voltage generation circuit. The provision of a reference voltage generation circuit, reference voltage line, shield line and internal voltage generation circuit in each internal circuit allows reduction in the resistance of the shield line. Therefore, the effect of noise on the shield line can be alleviated.

A semiconductor device according to yet a further aspect of the present invention includes a reference voltage generation circuit generating a reference voltage; a reference voltage line receiving the reference voltage generated at the reference voltage generation circuit; a shield line provided along the reference voltage line, and receiving a ground voltage; a plurality of internal voltage generation circuits arranged in an extending direction of the reference voltage line, each receiving the reference voltage from the reference voltage line to generate an internal voltage based on the received reference voltage; and a plurality of internal circuits provided corresponding to the plurality of internal voltage generation circuits, respectively, each driven by the internal voltage generated at a corresponding internal voltage generation circuit. Since a reference voltage generation circuit, reference voltage line, and shield line are provided common to the plurality of internal voltage generation circuits, the layout area is reduced.

A semiconductor device according to yet another aspect of the present invention includes a reference voltage generation circuit generating a reference voltage; a reference voltage line receiving the reference voltage generated at the reference voltage generation circuit; a plurality of internal voltage generation circuits arranged in an extending direction of the reference voltage line, each receiving the reference voltage from the reference voltage line to generate an internal voltage based on the received reference voltage; a plurality of shield lines provided corresponding to the plurality of internal voltage generation circuits, respectively, each provided along the reference voltage line, and receiving a ground voltage; and a plurality of internal circuits provided corresponding to the plurality of internal voltage generation circuits, respectively, each driven by the internal voltage generated at a corresponding internal voltage generation circuit. Since a reference voltage generation circuit and reference voltage line are provided common to the plurality of internal voltage generation circuits, the layout area is reduced. Further, since a shield line is provided for each internal voltage generation circuit, the effect of noise on the shield line can be alleviated.

A semiconductor device according to yet a still further aspect of the present invention includes a substrate having a surface divided into a plurality of regions in a first direction; a plurality of memory circuits provided at the plurality of regions, respectively; a plurality of power supply voltage lines provided corresponding to the plurality of memory circuits, respectively, each extending in a second direction orthogonal to the first direction, supplying a power supply voltage to a corresponding memory circuit; and a plurality of ground voltage lines provided corresponding to the plurality of memory circuits, respectively, each extending in the second direction, and supplying a ground voltage to a corresponding memory circuit. Since a power supply voltage line and ground voltage line are provided for each memory circuit, reduction in the power supply voltage and increase in the ground voltage can be suppressed.

According to the present invention set forth above, a semiconductor device that allows high-speed operation with low standby current can be provided. Further, a semiconductor device that can prevent application of excessive stress in a burn-in test mode can be provided. In addition, a semiconductor device having high operation speed can be provided. Further, a semiconductor device highly immune to noise can be provided. Additionally, a semiconductor device with small reduction in power supply voltage and increase in ground voltage can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
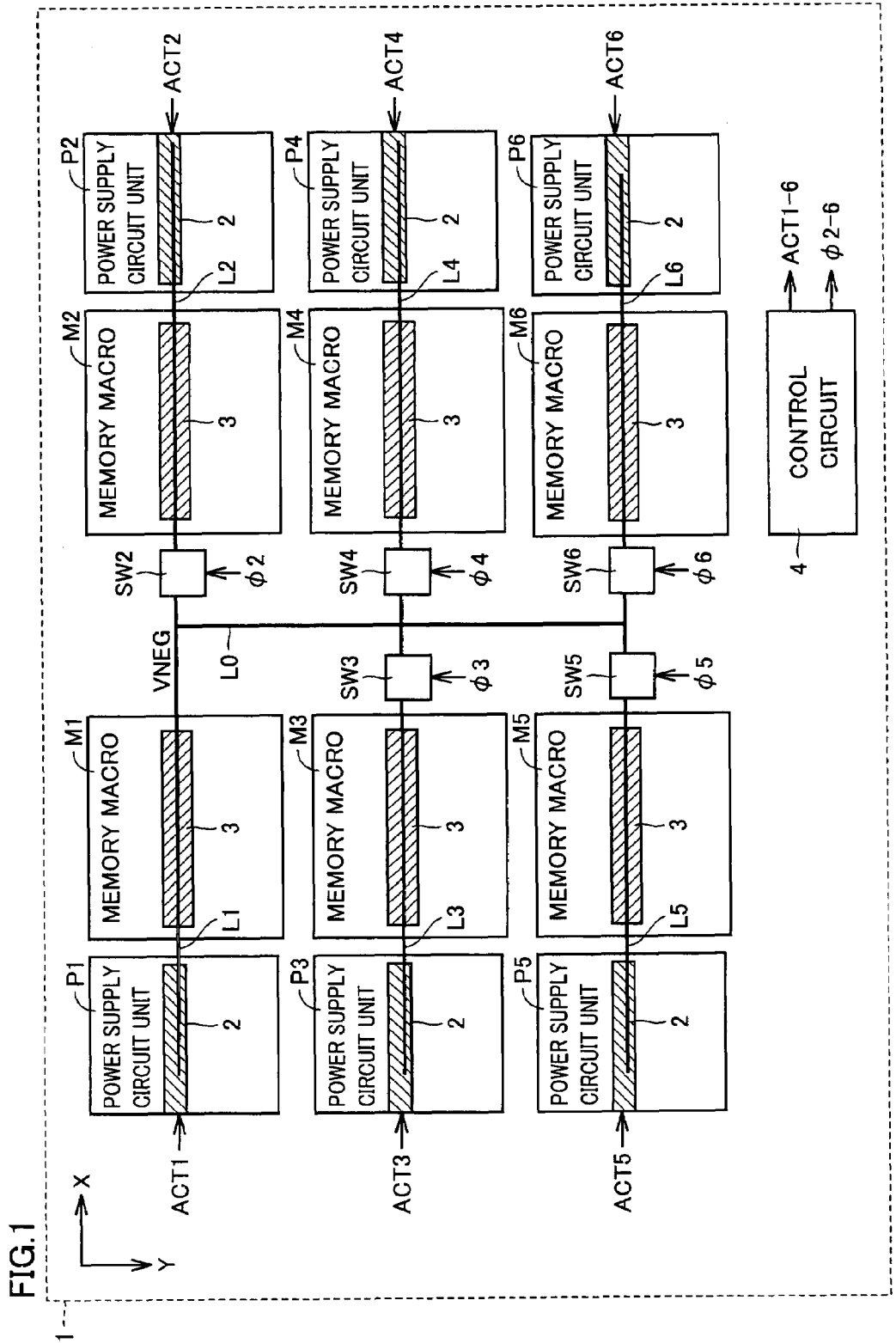
FIG. 1 is a block diagram of a configuration of a semiconductor integrated circuit device according to a first embodiment of the present invention.

Referring to FIG. 1, a semiconductor integrated circuit device according to a first embodiment of the present invention includes a semiconductor substrate 1, a plurality (six in the drawing) of memory macros M1-M6 formed at the surface of semiconductor substrate 1, each for a data write/read operation independently, six power supply circuit units P1-P6 provided corresponding to memory macros M1-M6, respectively, negative voltage supply lines L0-L6 and switch circuits SW2-SW6 for supplying a negative voltage VNEG generated at a negative voltage generation circuit 2 in each of power supply circuit units P1-P6 to a word line driver 3 in memory macros M1-M6, and a control circuit 4 generating control signals ACT1-ACT6 and ϕ2-ϕ6.

Negative voltage supply line L0 is arranged at the middle of semiconductor substrate 1, extending in the Y direction (vertical direction) in the drawing. Memory macros M1, M3 and M5 are arranged in the Y direction at the left side of negative voltage supply line L0. Power supply circuit units P1, P3 and P5 are arranged at the left side of memory macros M1, M3 and M5, respectively, adjacent thereto. Memory macros M2, M4 and M6 are arranged at the right side of negative voltage supply line L0, opposite to memory macros M1, M3, and M5, respectively. Power supply circuit units P2, P4 and P6 are arranged at the right side of memory macros M2, M4 and M6, respectively, adjacent thereto. Negative voltage generation circuit 2 in each of power supply circuit units P1-P6 is rendered active when a respective one of control signals ACT1-ACT6 is driven to an activation level to supply a negative voltage to negative voltage supply lines L1-L6, respectively.

Each of negative voltage supply lines L1-L6 extends in the X direction (lateral direction) in the drawing. Negative voltage supply line L1 is connected between negative voltage generation circuit 2 of power supply circuit unit P1 and a word line driver 3 of memory macro M1, and has one end connected to negative voltage supply line L0. Negative voltage supply line L2 is connected between negative voltage generation circuit 2 of power supply circuit unit P2 and word line driver 3 of memory macro M2, and has one end connected to negative voltage supply line L0 via switch circuit SW2.

Negative voltage supply line L3 is connected between negative voltage generation circuit 2 of power supply circuit unit P3 and word line driver 3 of memory macro 3, and has one end connected to negative voltage supply line L0 via switch circuit SW3. Negative voltage supply line L4 is connected between negative voltage generation circuit 2 of power supply circuit unit P4 and word line driver 3 of memory macro M4, and has one end connected to negative voltage supply line L0 via switch circuit SW4.

Negative voltage supply line L5 is connected between negative voltage generation circuit 2 of power supply circuit unit P5 and word line driver 3 of memory macro M5, and has one end connected to negative voltage supply line L0 via switch circuit SW5. Negative voltage supply line L6 is connected between negative voltage generation circuit 2 of power supply circuit unit P6 and word line driver 3 of memory macro M6, and has one end connected to negative voltage supply line L0 via switch circuit SW6. Switch circuits SW2-SW6 are rendered conductive and non-conductive when respective control signals ϕ2-ϕ6 are driven to an activation level and an inactivation level, respectively.

In an active mode in which data writing/reading of memory macros M1-M6 is allowed, control circuit 4 drives control signals ACT1-ACT6 to an activation level and control signals ϕ2-ϕ6 to an inactivation level. Accordingly, all negative voltage generation circuits 2 of power supply circuit units P1-P6 are rendered active and switch circuits SW2-SW6 are rendered non-conductive, whereby negative voltage VNEG is supplied to memory macros M1-M6 via negative voltage supply lines L1-L6, respectively, from each negative voltage generation circuit 2 of power supply circuit units P1-P6. Therefore, variation in negative voltage VNEG in each of memory macros M1-M6 can be reduced as compared to the conventional case in which one negative voltage generation circuit is provided for a plurality of memory macros. In an active mode, one or more of memory macros M1-M6 can be rendered active, and negative voltage generation circuit 2 of the power supply circuit unit corresponding to the activated memory macro can be rendered active.

In a standby mode in which the data is maintained at memory macros M1-M6, control circuit 4 drives control signals ACT1 and φ2-φ6 to an activation level, and control signals ACT2-ACT6 to an inactivation level. Accordingly, only negative voltage generation circuit 2 of power supply circuit unit P1 among power supply circuit units P1-P6 is rendered active and switch circuits SW2-SW6 are rendered conductive, whereby negative voltage VNEG is supplied to memory macros M1-M6 via negative voltage supply lines L0-L6, respectively, from negative voltage generation circuit 2 of power supply circuit unit P1. Therefore, the amount of through current flowing to, for example, a voltage divider circuit 5 and a detector circuit 10 in FIG. 2 can be reduced in a standby mode in which high-speed response is not necessary. Increase of standby current can be prevented without reduction in the operation speed in an active mode.

Figure 2:
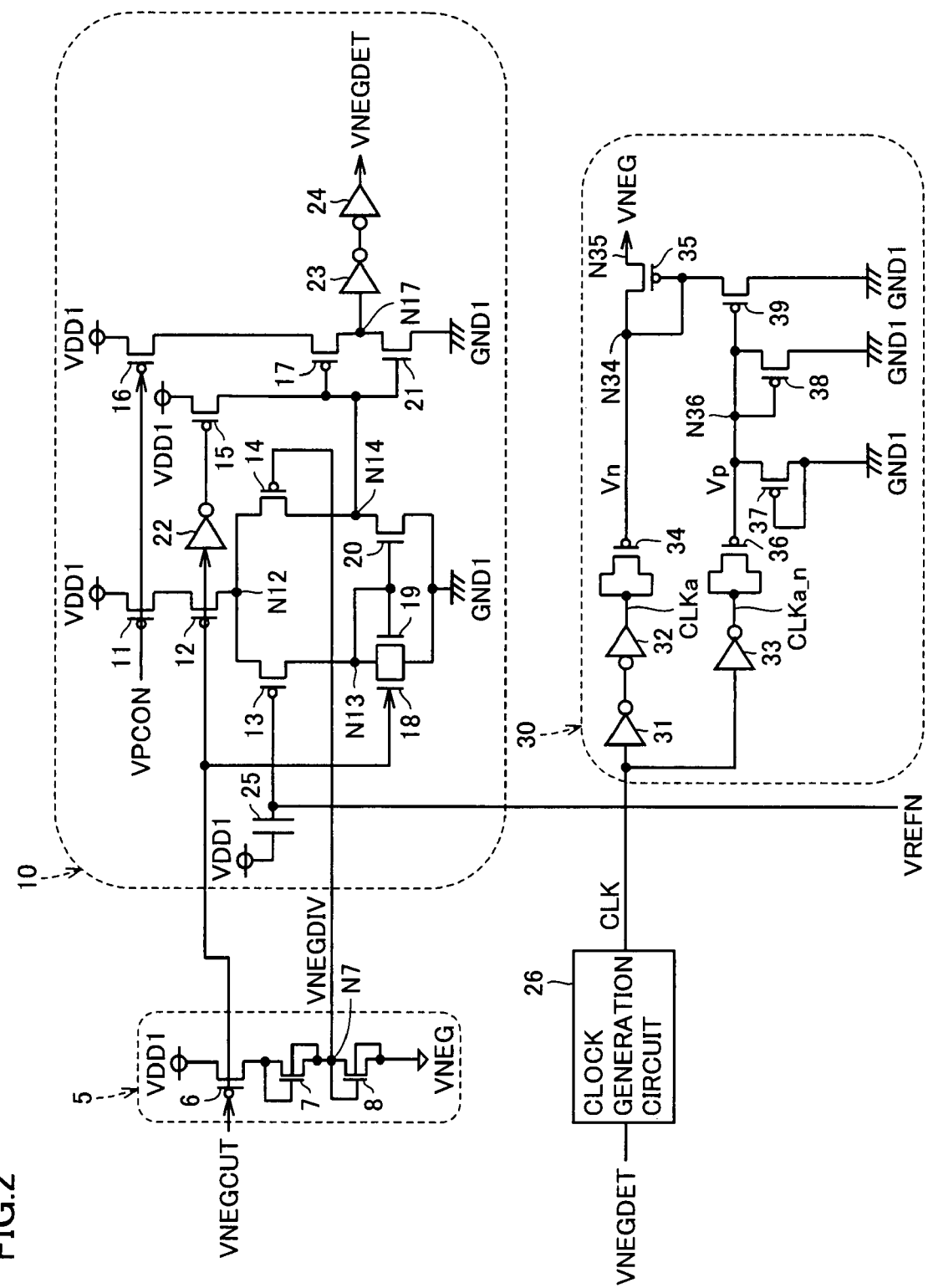
FIG. 2 is a circuit block diagram of a configuration of the negative voltage generation circuit shown in FIG. 1.

Referring to the circuit block diagram of FIG. 2, negative voltage generation circuit 2 includes a voltage divider circuit 5, a detector circuit 10, a clock generation circuit 26, and a charge pump circuit 30. Voltage divider circuit 5 and detector circuit 10 function to detect the level of the negative voltage. Clock generation circuit 26 is rendered active by an output signal VNEGDET of detector circuit 10. Charge pump circuit 30 is driven by an output clock signal CLK of a clock generation circuit 26. The amount of through current flowing to each element is large at the negative voltage detection circuit formed of voltage divider circuit 5 and detector circuit 10 having high-speed response.

Specifically, voltage divider circuit 5 includes a P channel MOS transistor 6 and N channel MOS transistors 7 and 8 connected in series between the line of external power supply voltage VDD1 (for example 1.2V) and the line of negative voltage VNEG (for example −0.6V). P channel MOS transistor 6 receives a signal VNEGCUT at its gate. Signal VNEGCUT is pulled down to an L level (logical low) of the activation level when the corresponding control signal ACT (for example, ACT1) is driven to an activation level. N channel MOS transistor 7 has its gate connected to its drain. N channel MOS transistor 8 has its gate connected to its drain (output node N7). Each of N channel MOS transistors 7 and 8 constitutes a diode element.

When signal VNEGCUT is pulled down to an L level of activation, P channel MOS transistor 6 conducts, and voltage divider circuit is rendered active. Voltage VNEGDIV of output node N7 attains an intermediate voltage level (in this case 0.3V) between external power supply voltage VDD1 and negative voltage VNEG. When signal VNEGCUT is pulled up to an H level (logical high) of inactivation, P channel MOS transistor 6 is rendered non-conductive, and voltage divider circuit 5 is rendered inactive.

Detector circuit 10 includes P channel MOS transistors 11-17, N channel MOS transistors 18-21, inverters 22-24, and a stabilization capacitor 25. P channel MOS transistors 11 and 12 are connected in series between the line of external power supply voltage VDD1 and a node N12, receiving signals VPCON and VNEGCUT, respectively, at their gates. Signal VPCON is pulled down to an L level of activation when a corresponding control signal ACT (for example, ACT1) is driven to an activation level. P channel MOS transistors 13 and 14 have their sources connected to node N12, their drains connected to nodes N13 and N14, respectively, and receive reference voltage VREFN and output voltage VNEGDIV from voltage divider circuit 5, respectively, at their gates. Stabilization capacitor 25 is connected between the line of external power supply voltage VDD1 and the gate of P channel MOS transistor 13 to prevent variation in reference voltage VREFN.

Figure 3:
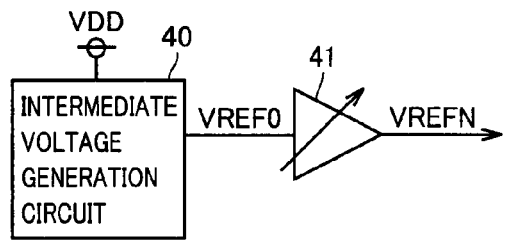
FIG. 3 is a block diagram of a configuration of the reference voltage generation circuit generating reference voltage shown in FIG. 2.

Reference voltage VREFN is generated at a reference voltage generation circuit formed of an intermediate voltage generation circuit 40 and a buffer circuit 41, as shown in FIG. 3. Intermediate voltage generation circuit 40 and buffer circuit 41 are provided common to negative voltage generation circuit 2 of power supply circuit units P1-P6, and is provided at power supply circuit unit P1, for example. Intermediate voltage generation circuit 40 generates an intermediate voltage VREF0 (in this case, 0.6V) of external power supply voltage VDD1 (for example, 1.2V). Buffer circuit 41 outputs a reference voltage VREFN (in this case, 0.3V) that is lower by 0.3V than output voltage VREF0 of intermediate voltage generation circuit 40.

Referring to FIG. 2 again, N channel MOS transistors 19 and 20 have their drains connected to nodes N13 and N14, respectively, their gates both connected to node N13, and their sources both connected to the line of ground voltage GND1. N channel MOS transistor 18 is connected between node N13 and the line of ground voltage GND1, receiving signal VNEGCUT at its gate. Transistors 11-14 and 18-20 constitute a comparator that compares the level between output voltage VNEGDIV of voltage divider circuit 5 and reference voltage VREFN to output a signal of a level according to the comparison result to output node N14.

When both signals VPCON and VNEGCUT attain an L level of activation, P channel MOS transistors 11 and 12 are rendered conductive and N channel MOS transistor 18 is rendered non-conductive, whereby the comparator formed of transistors 11-14 and 18-20 is rendered active. In the case where output voltage VNEGDIV of voltage divider circuit 5 is higher than reference voltage VREFN, the current flowing to transistors 13, 19 and 20 becomes higher than the current flowing to transistor 14, whereby node N14 attains an L level. In contrast, when output voltage VNEGDIV of voltage divider circuit 5 is lower than reference voltage VREFN, the current flowing to transistors 13, 19 and 20 becomes lower than the current flowing to transistor 14, whereby node N14 attains an H level.

P channel MOS transistor 15 is connected between the line of external power supply voltage VDD1 and node N14. P channel MOS transistors 16 and 17 and N channel MOS transistor 21 are connected in series between the line of external power supply voltage VDD1 and the line of ground voltage GND1. Signal VPCON is applied to the gate of P channel MOS transistor 16. Signal VNEGCUT is applied to the gate of P channel MOS transistor 15 via inverter 22. Transistors 17 and 21 both have their gates connected to node N14.

When signals VPCON and VNEGCUT attain an L level, P channel MOS transistor 15 is rendered non-conductive and P channel MOS transistor 16 is rendered conductive, whereby the inverter formed of transistors 17 and 21 is rendered active. This inverter provides a signal that is an inverted version of the signal at node N14 at output node N17. The output signal of this inverter is delayed at inverters 23 and 24 to serve as signal VNEGDET.

When signals VPCON and VNEGCUT both attain an H level, P channel MOS transistor 15 is rendered conductive and P channel MOS transistor 16 is rendered conductive, whereby the inverter formed of transistors 17 and 21 is rendered inactive. Node N14 is fixed at an H level, node N17 is fixed at an L level, and signal VNEGDET is fixed at an L level. Signal VNEGDET is applied to clock generation circuit 26.

When signal VNEGDET is at an H level, clock generation circuit 26 is rendered active to output a clock signal CLK of a predetermined frequency. When signal VNEGDET is at an L level, clock generation circuit 26 is rendered inactive to cease output of clock signal CLK. Clock signal CLK is applied to charge pump circuit 30.

Charge pump circuit 30 includes inverters 31-33, and P channel MOS transistors 34-39. P channel MOS transistors 34 and 36 have their respective sources and drains connected to each other. Each of P channel MOS transistors 34 and 36 constitute a capacitor. Clock signal CLK is applied to the source and drain of P channel MOS transistor 34 via inverters 31 and 32, and also to the source and drain of P channel MOS transistor 36 via inverter 33. P channel MOS transistor 35 is connected between an output node N35 of charge pump circuit 30 and the gate (node N34) of P channel MOS transistor 34, and has its gate connected to node N34. P channel MOS transistor 35 constitutes a diode element connected across nodes N35 and N34.

P channel MOS transistor 39 is connected between node N34 and the line of ground voltage GND1, and has its gate connected to the gate (node N36) of P channel MOS transistor 36. P channel MOS transistor 38 is connected between node N36 and the line of ground voltage GND1, and has its gate connected to node N36. P channel MOS transistor 38 constitutes a diode element connected between the line of ground voltage GND1 and node N36. P channel MOS transistor 37 is connected between node N36 and the line of ground voltage GND1, and has its gate connected to the line of ground voltage GND1. P channel MOS transistor 37 constitutes the diode element connected between node N36 and the line of ground voltage GND1.

Figure 4:
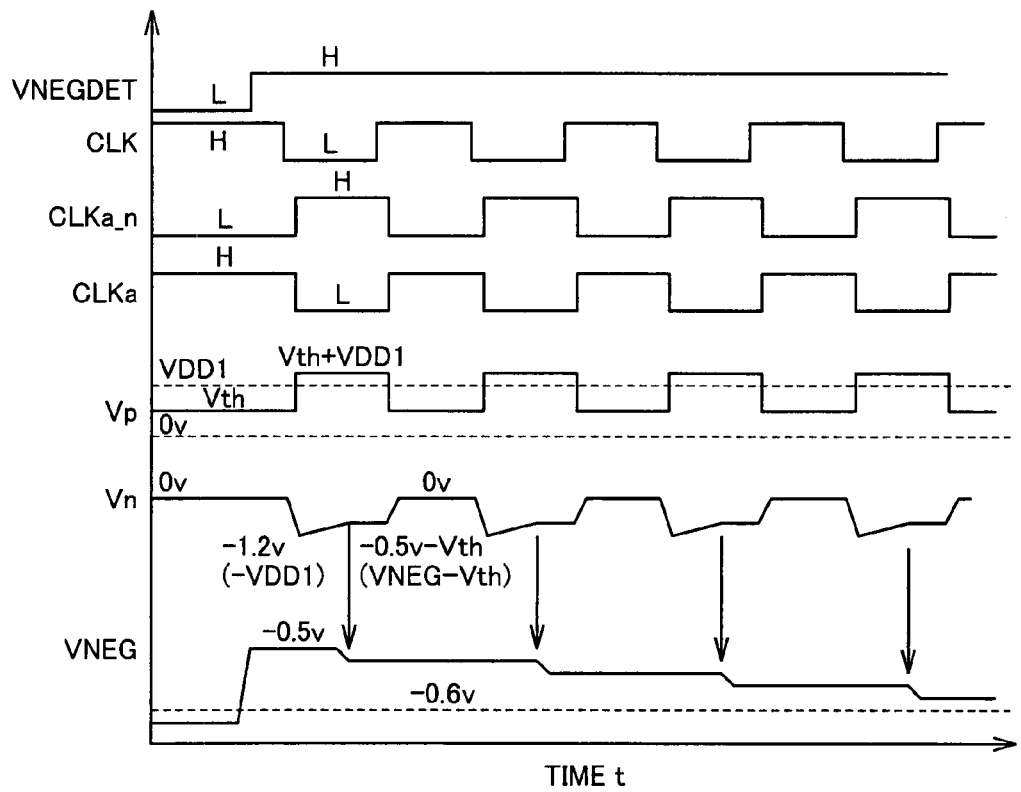
FIG. 4 is a timing chart indicating an operation of the negative voltage generation circuit shown in FIG. 2.

FIG. 4 is a timing chart indicating an operation of charge pump circuit 30. Referring to FIG. 4, it is assumed that negative voltage VNEG is maintained at a level of −0.6V or below, signal VNEGDET is maintained at an L level, and clock signal CLK is fixed at an H level, in the initial state. At this stage, an output signal CLKa_n of inverter 33 is at an L level and a clock signal CLKa of inverter 32 is at an H level. Voltage Vp of node N36 corresponds to threshold voltage Vth of P channel MOS transistor 37. Voltage Vn of node N34 corresponds to 0V.

When negative voltage VNEG rises to the level of −0.5V at a certain time, signal VNEGDET is pulled up to an H level from an L level, whereby clock generation circuit 26 is rendered active to output clock signal CLK. When clock signal CLK is pulled down to an L level from an H level, signal CLKa_n is pulled up to an H level from an L level, whereas signal CLKa is pulled down to an L level from an H level. In response, voltage Vp of node N36 rises from Vth to Vth+VDD1. P channel MOS transistor 39 is rendered non-conductive. Subsequent to the fall of voltage Vn of node N34 to −VDD1=−1.2V from 0V, positive charge flows from node N35 to node N34 via P channel MOS transistor 35. Thus, Vn=VNEG−Vth=−0.5V−Vth is established.

Then, when clock signal CLK is pulled up to an H level from an L level, signal CLKa_n is pulled down to an L level from an H level, whereas clock signal CLKa is pulled up to an H level from an L level. In response, voltage Vp of node N36 is reduced from Vth+VDD1 to Vth. P channel MOS transistor 39 is rendered conductive, and voltage Vn of node N34 attains the level of 0V. Thus, every time clock signal CLK is pulled down to an L level from an H level, positive charge is output from node N35. Accordingly, voltage VNEG of node N35 is gradually reduced. When voltage VNEG becomes as low as −0.6V and below, signal VNEGDET attains an L level and clock generation circuit 26 is rendered inactive. Charge pump circuit 30 ceases its operation.

The operation set forth above can be expressed in mathematical expressions, as will be described hereinafter. Output voltage VNEGDIV of voltage divider circuit 5 is represented as VNEGDIV=VDD1/2+VNEG/2. For example, when external power supply voltage VDD1 is 1.2V and negative voltage VNEG is −0.6V, VNEGDIV=0.3V is established. Therefore, by setting reference voltage VREFN to 0.3V, negative voltage VNEG can be maintained at −0.6V. It is to be noted that the mathematical expression of VNEG=2*VREF−VDD1 is established, based on expression deformation, when VNEGDIV=VREFN is inserted into the aforementioned equation VNEGDIV=VDD1/2+VNEG/2.

Figure 5:
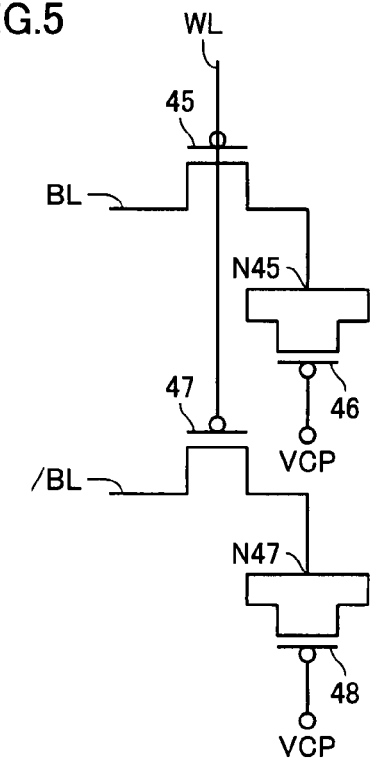
FIG. 5 is a circuit diagram of a configuration of a memory cell in the memory macro shown in FIG. 1.

FIG. 5 is a circuit diagram of a configuration of a memory cell included in each of memory macros M1-M6. Each of memory macros M1-M6 includes a plurality of memory cells arranged in a plurality of rows and columns, a plurality of word lines WL provided corresponding to respective plurality of rows, and a plurality of bit line pairs BL, /BL provided corresponding to respective plurality of columns. A memory cell includes P channel MOS transistors 45-48. P channel MOS transistor 45 is connected between a corresponding bit line BL and a storage node N45, and has its gate connected to a corresponding word line WL. P channel MOS transistor 46 receives a cell plate voltage VCP (=VDD1/2) at its gate, and has its source and drain connected to storage node N45. P channel MOS transistor 47 is connected between a corresponding bit line /BL and a storage node N47, and has its gate connected to a corresponding word line WL. P channel MOS transistor 48 receives cell plate voltage VCP (=VDD1/2) at its gate, and has its source and drain connected to storage node N47. Each of P channel MOS transistors 45 and 47 constitutes a transfer gate of a memory cell. Each of P channel MOS transistors 46 and 47 constitutes a capacitor.

In a write operation mode, word line WL of a selected row is set at a select level (ground voltage VNEG), and potentials corresponding to the write data is applied to bit lines BL, /BL of the selected column. For example, when data "1" is to be written, bit lines BL, /BL are set at an H level (VDD1) and an L level (GND1), respectively. When data "0" is to be written, bit lines BL, /BL are set at an L level and an H level, respectively. In response, P channel MOS transistors 45 and 47 are rendered conductive. The potentials of bit lines BL, /BL are written into storage nodes N45 and N47, respectively. When word line WL is set at a non-select level (boosted voltage VPP>VDD1), P channel MOS transistors 45 and 47 are rendered non-conductive. The potentials of storage nodes N45, N47, i.e. the data, are retained.

In a readout operation mode, selected word line WL attains a select level after bit lines BL, /BL are precharged to the level of bit line precharge voltage VPRE (VDD1/2). In response, the potentials at each of bit lines BL, /BL vary slightly according to the potentials at storage nodes N45 and N47, respectively. The small potential difference between bit lines BL, /BL is amplified to power supply voltage VDD1 by a sense amplifier (not shown). The potential difference between bit lines BL, /BL is read out as data, and the potentials of bit lines BL, /BL are written again to storage nodes N45 and N47, respectively. When word line WL is set at a non-select level, P channel MOS transistors 45 and 47 are rendered non-conductive. Thus, a readout operation ends.

Figure 6:
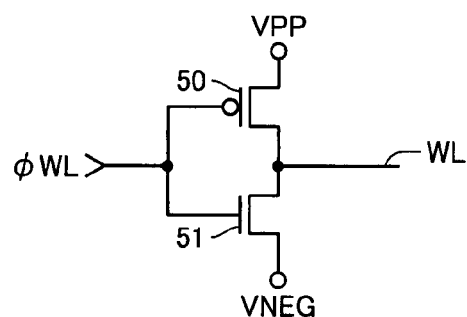
FIG. 6 is a circuit diagram of a configuration of a word line driver unitary circuit in the word line driver shown in FIG. 1.

FIG. 6 is a circuit diagram of a configuration of a word line driver unitary circuit in word line driver 3 of memory macros M1-M6. Referring to FIG. 6, word line driver 3 includes a word line driver unitary circuit provided corresponding to each word line WL. The world line driver unitary circuit includes a P channel MOS transistor 50 and an N channel MOS transistor 51. P channel MOS transistor 50 receives boosted voltage VPP at its gate, has its drain connected to a corresponding word line WL, and receives a control signal φWL at its gate. N channel MOS transistor 51 receives negative voltage VNEG at its source, has its drain connected to a corresponding word line WL, and receives control signal φWL at its gate.

When a corresponding word line WL is selected, control signal φWL is set at an H level of the select level. In response, P channel MOS transistor 50 is rendered non-conductive and N channel MOS transistor 50 is rendered conductive. Word line WL attains a select level (negative voltage VNEG). When corresponding word line WL is not selected, control signal φWL is at an L level corresponding to a non-select level. In response, N channel MOS transistor 51 is rendered non-conductive, whereas P channel MOS transistor 50 is rendered conductive. Word line WL is set at a non-select level (boosted voltage VPP).

Since negative voltage VNEG is used as the driving voltage of the word line driver unitary circuit at memory macros M1-M6, high-speed response is particularly required at negative voltage generation circuit 2. In a conventional DRAM using an N channel MOS transistor as the transfer gate of a memory cell, high-speed response at the negative voltage generation circuit is not required since boosted voltage VPP and ground voltage GND1 are employed as the driving voltage of the word line driver unitary circuit.

Figure 7:
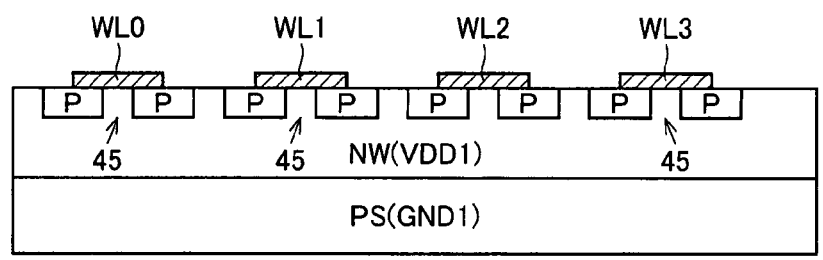
FIG. 7 is a sectional view of a configuration of a memory cell array including the memory cell shown in FIG. 5.

FIG. 7 is a sectional view of a configuration of a memory cell array included in each of memory macros M1-M6. Referring to FIG. 7, an N type well NW is formed at the surface of a P type semiconductor substrate PS. A plurality of memory cells are formed at the surface of an N type well NW. FIG. 7 shows a plurality of P channel MOS transistors 45 formed at the surface of N type well NW. P channel MOS transistor 45 includes a source and drain (P type impurity diffusion region) formed at the surface of N type well NW, and a gate electrode (word line WL). In order to prevent a current flow in the forward direction at each PN junction, ground voltage GND1 is applied to P type semiconductor substrate PS, whereas external power supply voltage VDD1 is applied to N type well NW.

Memory macros M1-M6 have almost no parasitic capacitance to hold negative voltage VNEG in the case where a negative voltage is not used as the substrate bias voltage as in a conventional DRAM. Therefore, further high-speed response is required for negative voltage generation circuit 2 of memory macros M1-M6. In a conventional DRAM that uses an N channel MOS transistor as the transfer gate of a memory cell, the parasitic capacitance of the negative voltage was so large that high-speed response of negative voltage was not required since an N type well (power supply voltage) is formed at the surface of a P type semiconductor substrate (ground voltage), a P type well (negative voltage) is formed at the surface of an N type well, and an N channel MOS transistor of a memory cell was formed at the surface of a P type well.

As set forth above, a negative voltage generation circuit 2 is provided at each of power supply circuit units P1-P6 for memory macros M1-M6 in the first embodiment. As compared to the conventional case in which only one negative voltage generation circuit is provided for memory macros M1-M6, the time required for the variation in negative voltage VNEG of memory macros M1-M6 to be propagated to detector circuit 10 of negative voltage generation circuit 2 becomes shorter, such that the time required for charge pump circuit 30 of negative voltage generation circuit 2 to supply negative current in response to the variation becomes shorter. As a result, the response to variation in negative voltage VNEG becomes faster. Thus, increase of negative voltage VNEG to cause delay in the operation speed in an active mode can be prevented. Since negative voltage supply lines L1-L6 for memory macros M1-M6 are connected by switch circuits SW2-SW6, and only one of the six negative voltage generation circuits 2 is rendered active in a standby mode, increase in standby current can be prevented.

The first embodiment is not limited to the above-described case in which only one of the six negative voltage generation circuits 2 is rendered active in a standby mode. Only two, three, four or five of the six negative voltage generation circuits 2 may be rendered active in a standby mode. The standby current can be reduced even in such cases. Further, negative voltage VNEG can be used as the substrate bias voltage.

Figure 8:
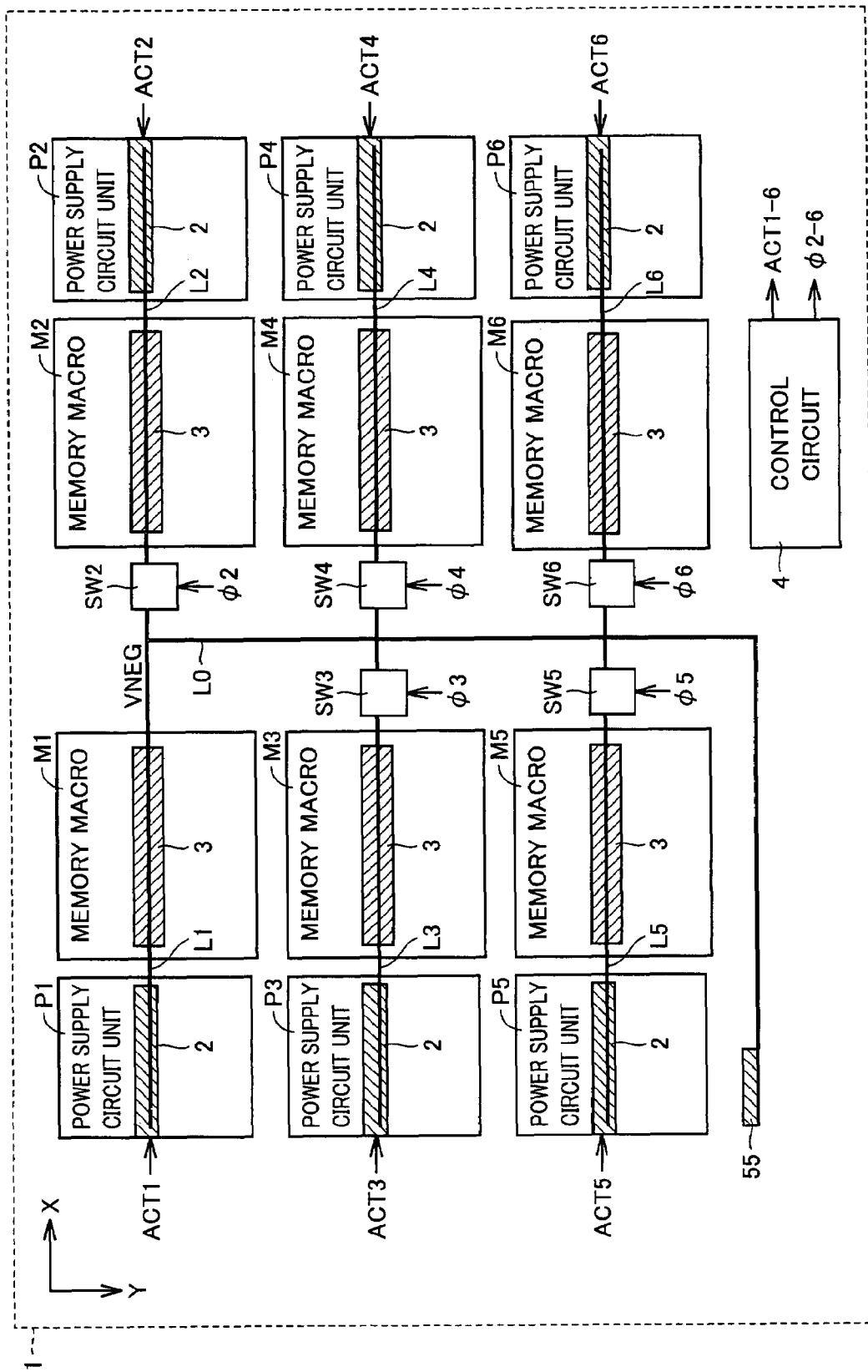
FIG. 8 is a block diagram of a modification of the first embodiment.

FIG. 8 is a block diagram of a modification of the first embodiment, comparable to FIG. 1. This modification of FIG. 8 differs from the semiconductor integrated circuit device of FIG. 1 in that a negative voltage generation circuit 55 for standby is added, and all the six negative voltage generation circuits 2 are inactive in a standby mode. Standby negative voltage generation circuit 55 is similar to negative voltage generation circuit 2, and includes voltage divider circuit 5, detector circuit 10, clock generation circuit 26, and charge pump circuit 30, shown in FIG. 2. Standby negative voltage generation circuit 55 is constantly active to maintain negative voltage supply line L0 at the level of negative voltage VNEG. It is to be noted that the through current of detector circuit 10 of standby negative voltage generation circuit 55 is smaller than the through current of detector circuit 10 of negative voltage generation circuit 2. The current supply capability of charge pump circuit 30 of standby negative voltage generation circuit 55 is lower than the current supply capability of charge pump circuit 30 of negative voltage generation circuit 2. Therefore, the power consumption of standby negative voltage generation circuit 55 is smaller than that of negative voltage generation circuit 2. Advantages similar to those of the first embodiment set forth above can be achieved in this modification.

Figure 9:
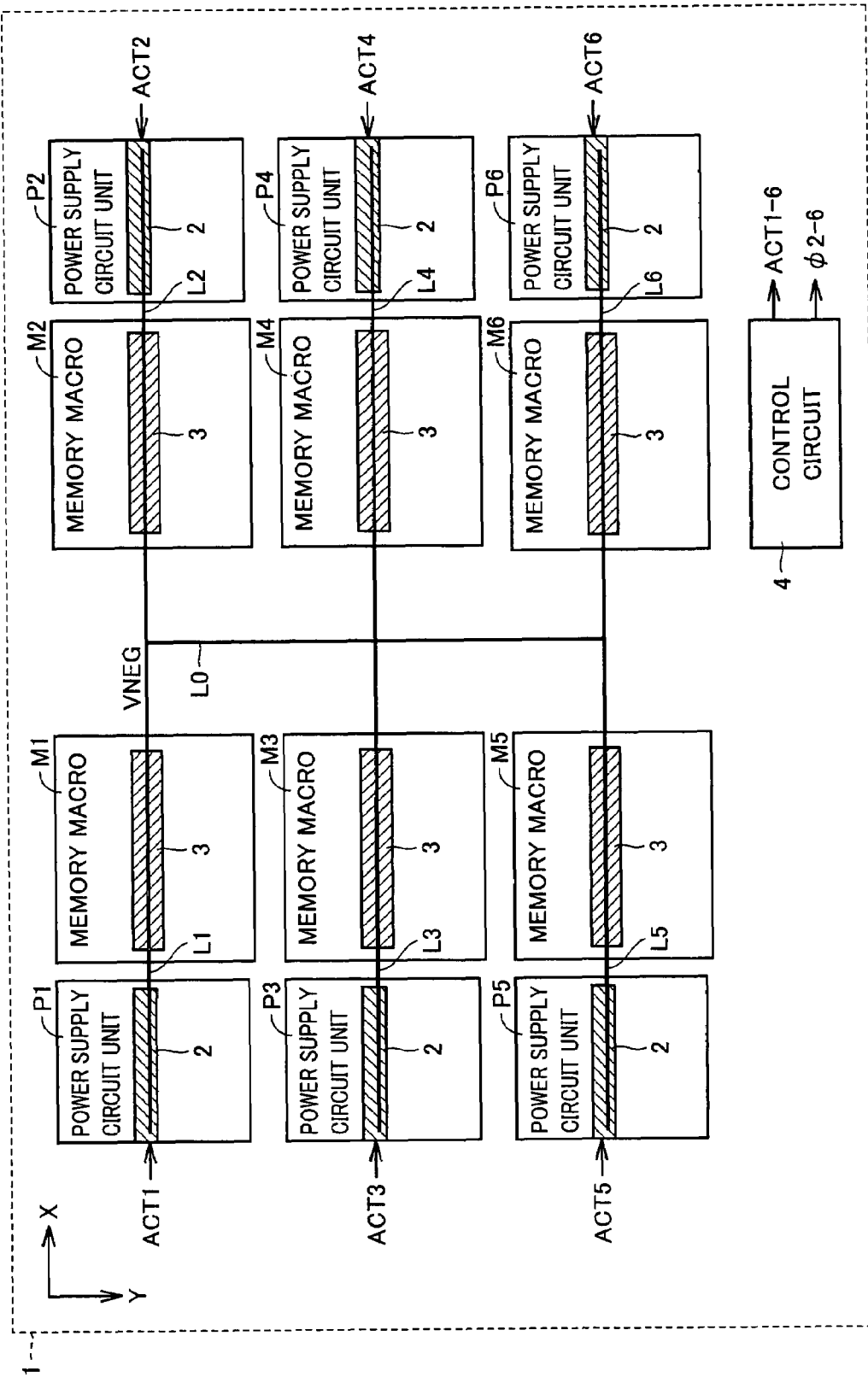
FIG. 9 is a block diagram of another modification of the first embodiment.

FIG. 9 is a block diagram of another modification of the first embodiment, comparable to FIG. 1. This modification of FIG. 9 differs from the semiconductor integrated circuit device of FIG. 1 in that switch circuits SW2-SW6 are removed, and negative voltage supply lines L0-L6 are constantly conductive. This modification is advantageous in that the layout area can be reduced corresponding to switch circuits SW2-SW6, in addition to the advantages set forth above of the first embodiment.

Figure 10:
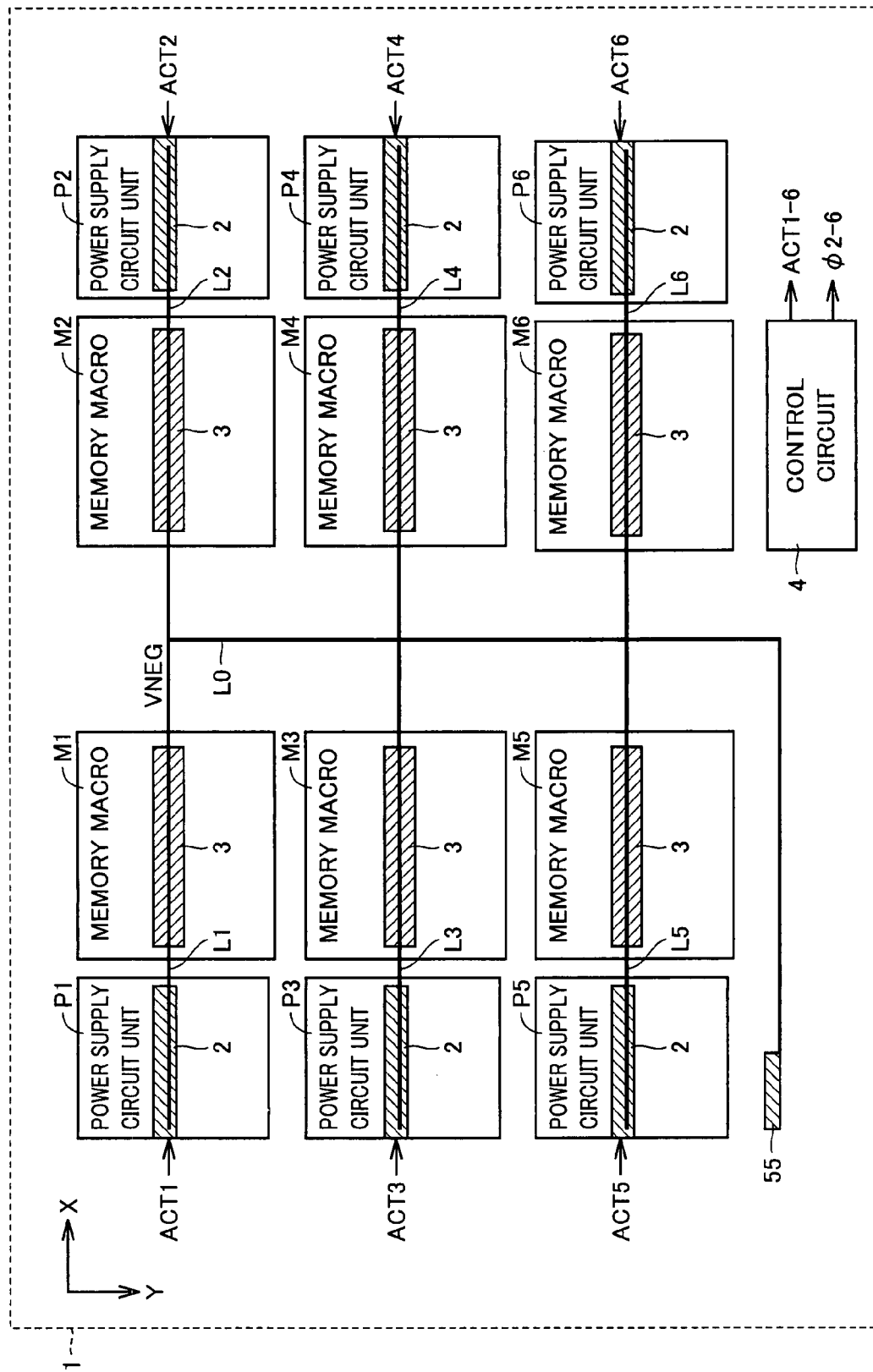
FIG. 10 is a further modification of the first embodiment.

FIG. 10 is a block diagram of still another modification of the first embodiment, comparable to FIG. 8. This modification of FIG. 10 differs from the semiconductor integrated circuit device of FIG. 8 in that switch circuits SW2-SW6 are removed, and negative voltage supply lines L0-L6 are constantly conductive. This modification is advantageous in that the layout area can be reduced corresponding to switch circuits SW2-SW6, in addition to the advantages set forth above of the modification of FIG. 8.

Second Embodiment

A semiconductor integrated circuit device including a DRAM using a P channel MOS transistor as the transfer gate of a memory cell is subjected to a burn-in test (acceleration test), likewise a conventional DRAM, for screening early failure. In a burn-in test, a voltage higher than that of a general level is applied. The application of negative voltage VNEG to this type of semiconductor integrated circuit device in a burn-in test may apply excessive stress across the source and drain of the transistor, leading to the possibility of increasing early failure.

Figure 11:
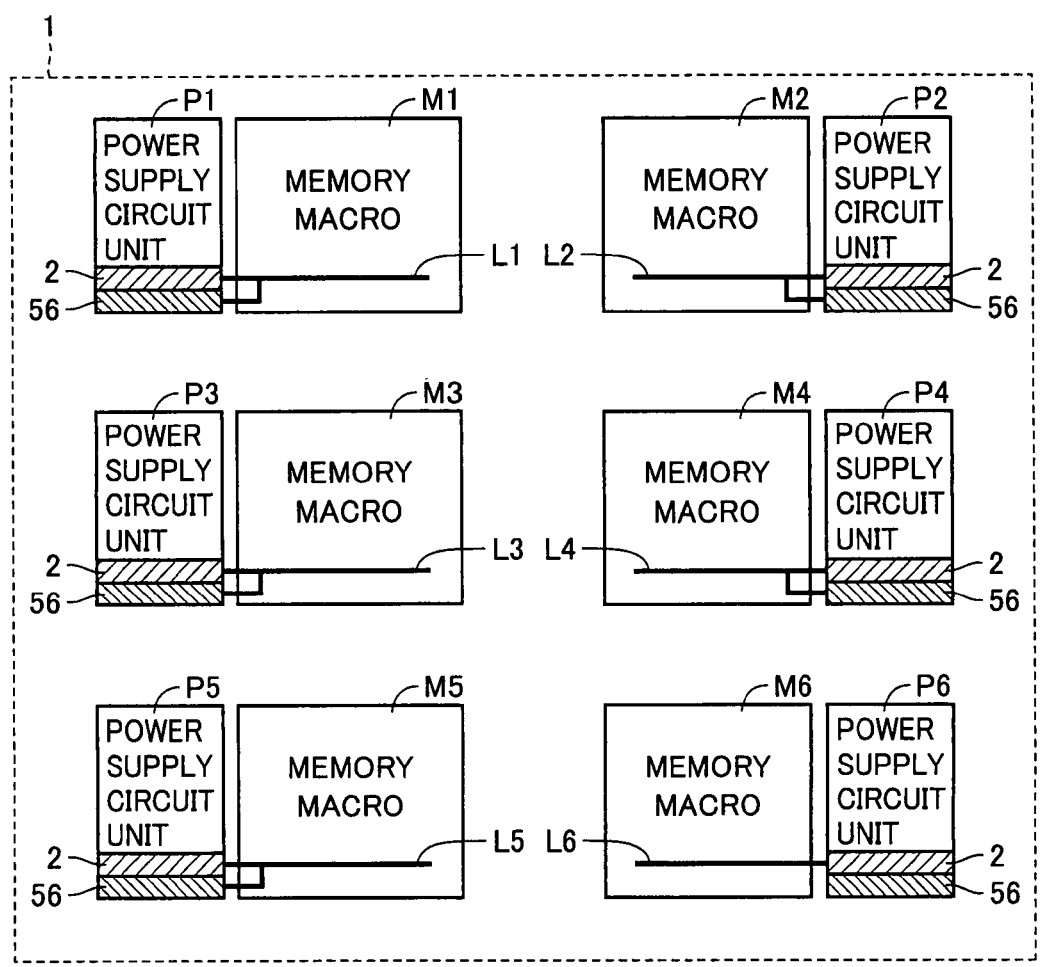
FIG. 11 is a block diagram to describe a problem in this type of semiconductor integrated circuit device.

In view of this possibility, there is an approach to dispose an internal voltage switch circuit 56 to switch negative voltage VNEG to ground voltage GND in order to prevent application of excessive stress during a burn-in test, at each of power supply circuit units P1-P6, as shown in FIG. 11. Specifically, this semiconductor integrated circuit device has negative voltage supply lines L1-L6 provided corresponding to memory macros M1-M6, respectively, wherein each of power supply circuit units P1-P6 includes a negative voltage generation circuit 2 maintaining the corresponding negative voltage supply line at negative voltage VNEG, and an internal voltage switch circuit 56 applying ground voltage GND to the corresponding negative voltage supply line in a burn-in test. Negative voltage generation circuit 2 of power supply circuit units P1-P6 is rendered inactive in a burn-in test.

Since the semiconductor integrated circuit device of FIG. 11 has internal voltage switch circuit 56 provided at each of power supply circuit units P1-P6, stable internal voltage GND can be supplied to memory macros M1-M6 without having to take into account wiring resistance or the like. It is to be noted that this semiconductor integrated circuit device is disadvantageous in that the layout area is increased since internal voltage switch circuit 56 must be arranged at each of power supply circuit units P1-P6.

Figure 12:
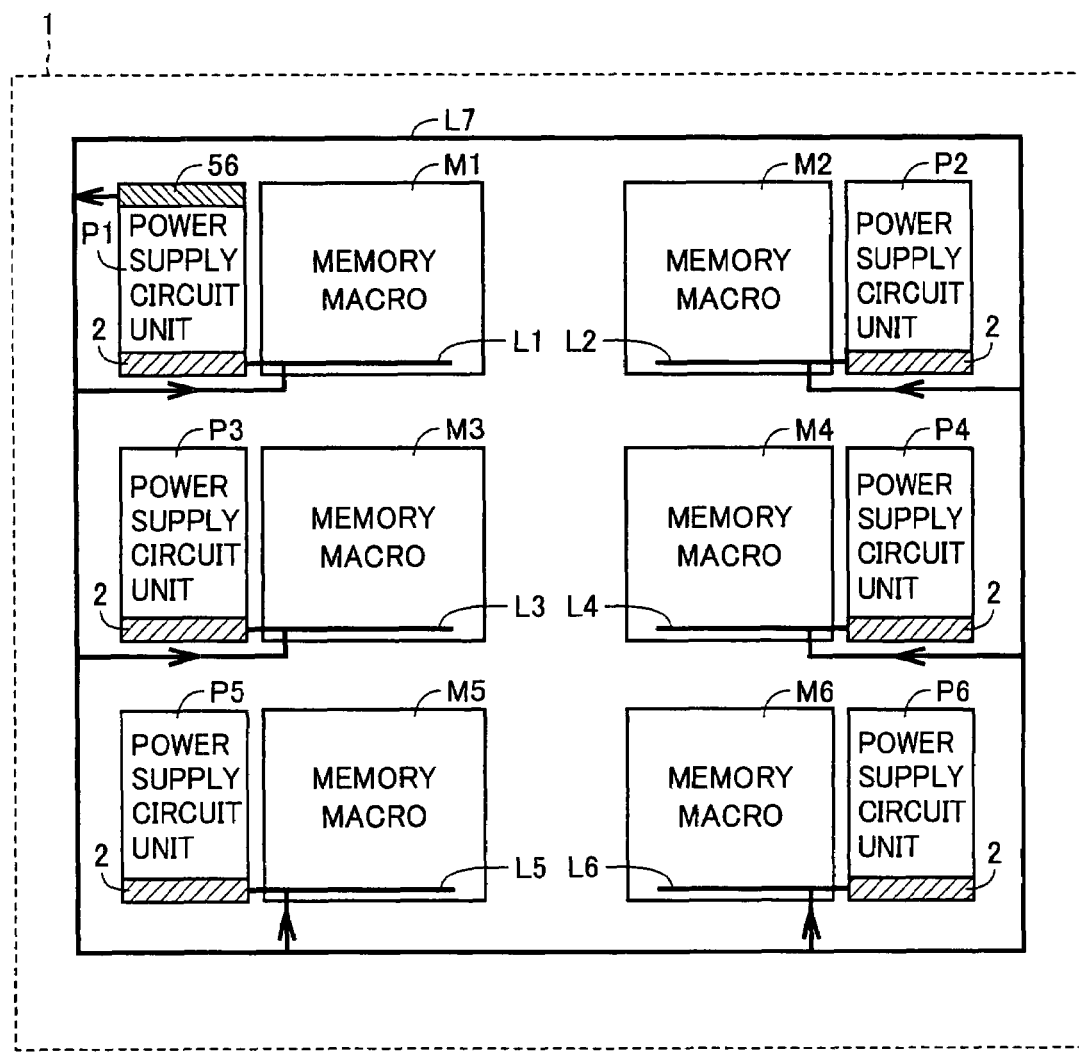
FIG. 12 is a block diagram of a configuration of a semiconductor integrated circuit device according to a second embodiment of the present invention.

It is to be also noted that the operating frequency in a burn-in test is low, so that the time for restoration of the voltage drop of the internal voltage is sufficient. Therefore, internal voltage switch circuit 56 is disposed at only power supply circuit unit P1 in the second embodiment, as shown in FIG. 12. Internal voltage switch circuit 56 of power supply circuit unit P1 supplies ground voltage GND to negative voltage supply lines L1-L6 via internal voltage line L7 in a burn-in test. Accordingly, increase in layout area can be suppressed. Alternatively, internal voltage switch circuit 56 may be disposed at other power supply circuit units P2-P6; instead of at power supply circuit unit P1.

Third Embodiment

Figure 13:
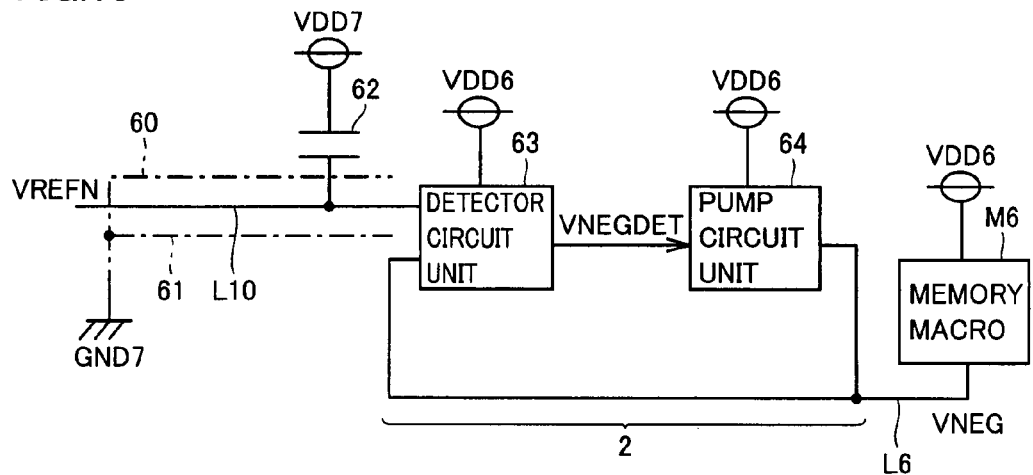
FIG. 13 is a block diagram to describe a problem in this type of semiconductor integrated circuit device.

Reference voltage VREFN is supplied from one reference voltage generation circuit formed of intermediate voltage generation circuit 40 and buffer circuit 41 to negative voltage generation circuit 2 of six power supply circuit units P1-P6, as shown in FIG. 3. If the reference voltage generation circuit is disposed at power supply circuit unit P1, for example, the routing length of reference voltage line L10 that supplies reference voltage VREFN from the reference voltage generation circuit to negative voltage generation circuit 2 of power supply circuit unit P6 is increased significantly, leading to the possibility of noise generation at reference voltage line L1. In view of this possibility, this type of semiconductor integrated circuit is provided with shield lines 60 and 61 sandwiching reference voltage line L10 to protect reference voltage line L10 from noise as shown in FIG. 13. Shield lines 60 and 61 are connected to the line of ground voltage GND 7 dedicated to shielding. Further, a stabilization capacitor 62 is provided between the termination of reference voltage supply line L10 and the line of the external power supply voltage VDD7 in order to stabilize reference voltage VREFN. The capacitance of stabilization capacitor 62 is set to a value sufficiently larger than the parasitic capacitance of reference voltage line L10 (for example, ten times larger). This stabilization capacitor 62 reduces the noise of reference voltage line L10 to a level of 1/10 or below. Further, the noise applied to reference voltage line L1 from negative voltage generation circuit 2 is also alleviated. Stabilization capacitor 62 is to be formed of a gate capacitor or the like provided between the gate of a transistor and a substrate or well.

Detector circuit unit 63 includes voltage divider circuit 5 and detector circuit 10 of FIG. 2, and sets signal VNEGDET to an H level and an L level when negative voltage VNEG is higher and lower, respectively, than target voltage 2V1−VDD (where V1=VREFN). Pump circuit unit 64 includes clock generation circuit 26 and charge pump circuit 30 of FIG. 2, and is rendered active when signal VNEGDET is at an H level to supply negative charge to negative voltage supply line L6 (output positive charge), and rendered inactive when signal VNEGDET is at an L level to cease supply of negative charge. Detector circuit unit 63, pump circuit unit 64, and memory macro M6 are connected to the line of external power supply voltage VDD6 for power supply circuit unit P6 and memory macro M6.

Figure 14:
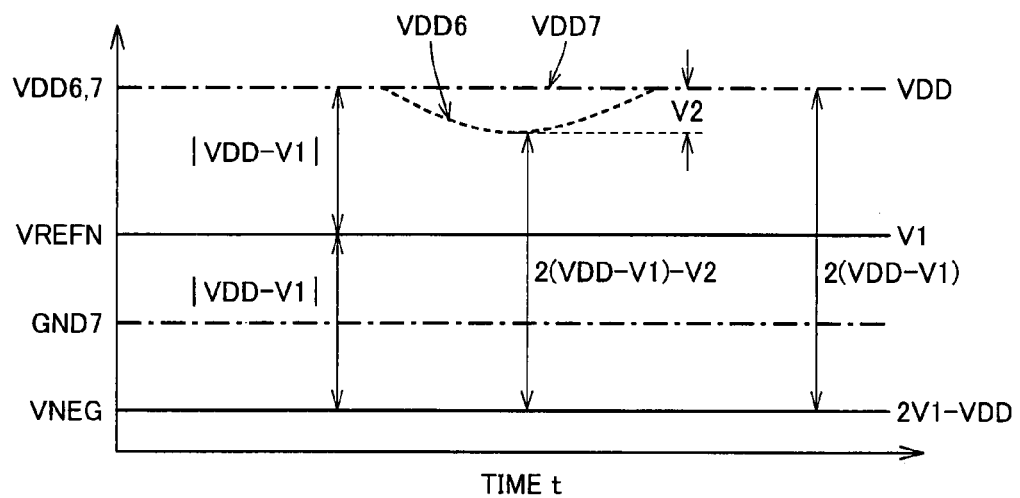
FIG. 14 is a timing chart indicating an operation of the semiconductor integrated circuit device shown in FIG. 13.

FIG. 14 is a timing chart of the level variation of external power supply voltages VDD6 and VDD7, reference voltage VREFN, ground voltage GND7, and negative voltage VNEG. External power supply voltages VDD6 and VDD7 having the same level are supplied from different power supply pads and lines. When negative voltage generation circuit 2 and memory macro M6 operate, current is consumed so that external power supply voltage VDD6 is reduced to the level of VDD−V2, for example. However, external power supply voltage VDD7 dedicated to shielding exhibits little or no variation. Since external power supply voltage VDD7 hardly varies, level V1 of reference voltage VREF is also constant, and negative voltage VNEG does not change from the level of 2V1−VDD. Therefore, there is a problem that the level of drive voltage VDD6−VNEG is reduced from the level of 2 (VDD−V1) to 2 (VDD−V1)−V2, resulting in lower operation speed at memory macro M6.

Figure 15:
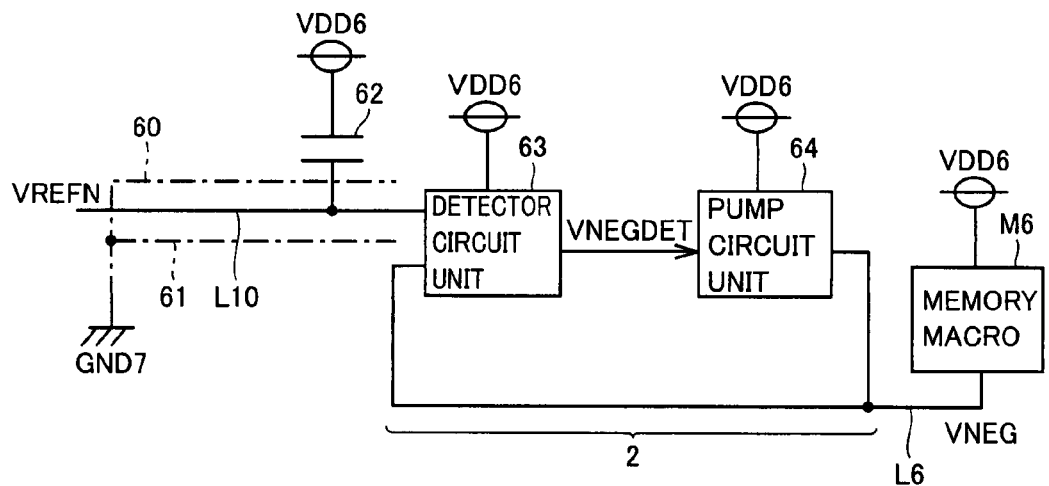
FIG. 15 is a block diagram of a main part of a semiconductor integrated circuit device according to a third embodiment of the present invention.
Figure 16:
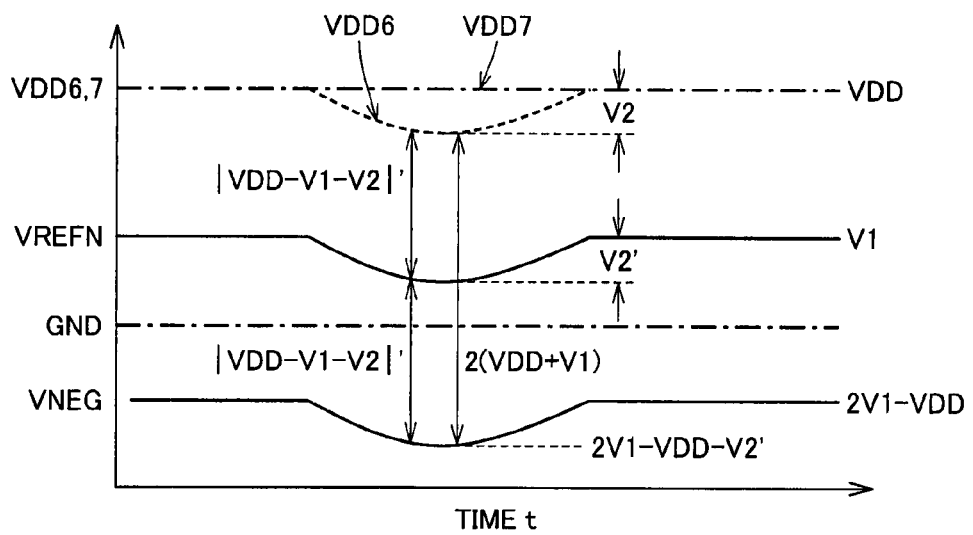
FIG. 16 is a timing chart indicating an operation of the semiconductor integrated circuit device shown in FIG. 15.

In view of this problem, one electrode of stabilization capacitor 62 is connected to the line of external power supply voltage VDD6 for power supply circuit unit P6 and memory macro M6, instead of the line of external power supply voltage VDD7 dedicated to shielding, as shown in FIG. 15 in the third embodiment. Accordingly, when external power supply voltage VDD6 is reduced to VDD−V2, reference voltage VREFN is reduced to the level of V1−V2', and negative voltage VNEG is reduced to the level of 2V1−VDD−V2', as shown in FIG. 16. Here, V2≈V2' is established, since the capacitance of stabilization capacitor 62 is sufficiently larger than the parasitic capacitance of reference voltage line L10. Therefore, even if external power supply voltage VDD6 is reduced, drive voltage VDD6−VNEG of memory macro M6 is maintained at the level of substantially 2 (VDD−V1), so that the operation speed of memory macro M6 will not be degraded. Although the above description is based on memory macro M6, the same applies to other memory macros.

Fourth Embodiment

Figure 17:
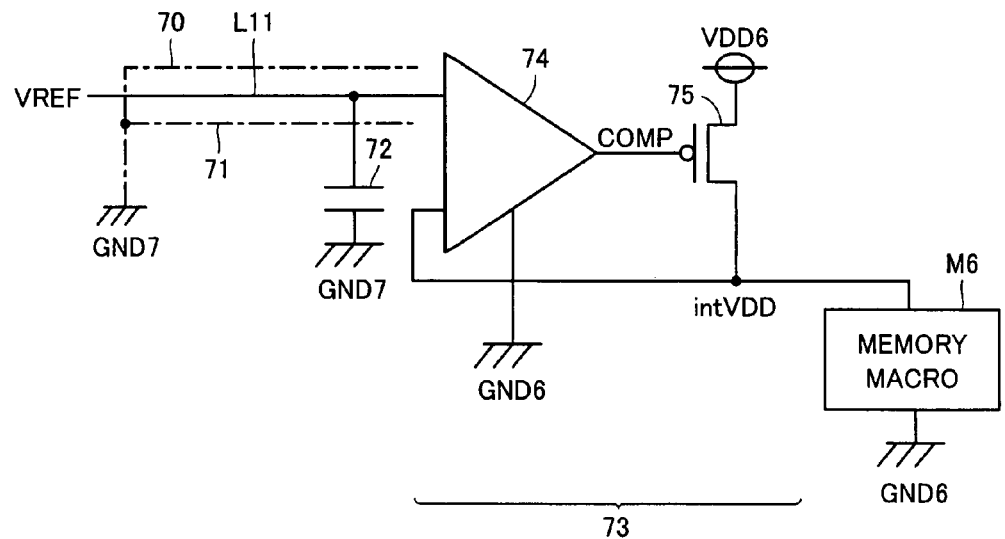
FIG. 17 is a block diagram to describe a problem in this type of semiconductor integrated circuit device.

FIG. 17 is a circuit block diagram of a main part of this type of semiconductor integrated circuit device. In this semiconductor integrated circuit device of FIG. 17, reference voltage VREF generated at the reference voltage generation circuit (not shown) is supplied to a VDC (Voltage Down Converter) circuit 73 in power supply circuit unit P6 via reference voltage line L11.

In this semiconductor integrated circuit, shield lines 70 and 71 are provided to sandwich reference voltage line L11 in order to protect reference voltage line L11 from noise. Shield lines 70 and 71 are connected to the line of ground voltage GND7 dedicated to shielding. A stabilization circuit 72 is provided between the termination of reference voltage supply line L11 and the line of ground voltage GND7 in order to stabilize reference voltage VREF. The capacitance of stabilization capacitor 72 is set to a value sufficiently larger than the parasitic capacitance of reference voltage line L11 (for example, ten times larger). Stabilization capacitor 72 reduces the noise at reference voltage line L11 to a level of 1/10 or below, and also alleviates noise from VDC circuit 73.

Figure 18:
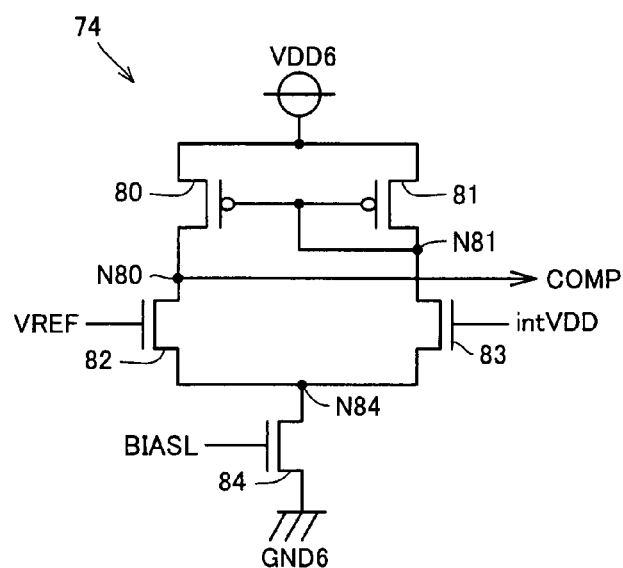
FIG. 18 is a block diagram of a configuration of the comparator shown in FIG. 17.

VDC circuit 73 includes a comparator 74 and a P channel MOS transistor 75. As shown in FIG. 18, comparator 74 includes P channel MOS transistors 80 and 81, and N channel MOS transistors 82-84. P channel MOS transistors 80 and 81 have their sources both connected to the line of external power supply voltage VDD6, their drains connected to nodes N80 and N81, respectively, and their gates both connected to a node N81. P channel MOS transistors 80 and 81 constitute a current mirror circuit. Signal COMP at node N80 is the output signal of comparator 74. N channel MOS transistors 82 and 83 have their drains connected to nodes N80 and N81, respectively, receive reference voltage VREF and internal power supply voltage intVDD, respectively, at their gates, and have their sources connected to a node N84. N channel MOS transistor 84 is connected between node N84 and the line of ground voltage GND6, and receives control signal BIASL at its gate. P channel MOS transistor 75 is connected between the line of external power supply voltage VDD6 and the line of internal power supply voltage intVDD, and receives output signal COMP from comparator 74 at its gate.

When control signal BIASL attains an H level, N channel MOS transistor 84 conducts and comparator 74 is rendered active. When internal power supply voltage intVDD is lower than reference voltage VREF, the current flowing to transistors 80, 81 and 83 becomes smaller than the current flowing to transistor 82 to cause signal COMP to attain an L level. P channel MOS transistor 75 conducts and internal power supply voltage intVDD rises. In contrast, when internal power supply voltage intVDD is higher than reference voltage VREF, the current flowing to transistors 80, 81 and 83 becomes larger than the current flowing to transistor 82 to cause signal COMP to attain an H level. P channel MOS transistor 75 is rendered non-conductive and internal power supply voltage intVDD is reduced. Therefore, internal power supply voltage intVDD becomes equal to reference voltage VREF.

Internal power supply voltage intVDD is applied to memory macro M6. VDC circuit 73 and memory macro M6 are connected to the line of ground voltage GND for power supply circuit unit P6 and memory macro M6. Memory macro M6 is driven by the difference in level between internal power supply voltage intVDD and ground voltage GND6.

Figure 19:
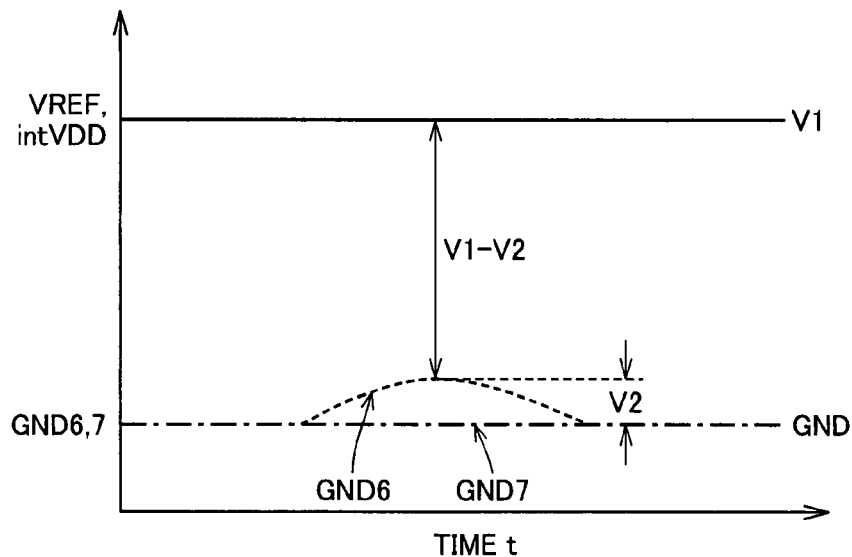
FIG. 19 is a timing chart indicating an operation of the semiconductor integrated circuit device shown in FIG. 17.

FIG. 19 is a timing chart representing the level variation in power supply voltage VREF, internal power supply voltage intVDD, and ground voltages GND6 and GND7. Ground voltages GND6 and GND7 having the same level are supplied from different power supply pads and lines. When VDC circuit 73 and memory macro M6 operate, current flows in such that ground voltage GND6 rises to, for example, GND+V2. However, ground voltage GND7 dedicated to shielding exhibits little or no variation. Since there is little or no variation in ground voltage GND7, level V1 of reference voltage VREF is also constant, and the level of internal power supply voltage intVDD does not vary from V1. Therefore, there is a problem that drive voltage intVDD–GND6 is reduced to the level of V1–V2 from V1 at memory macro M6, leading to the problem that the operation speed is reduced.

Figure 20:
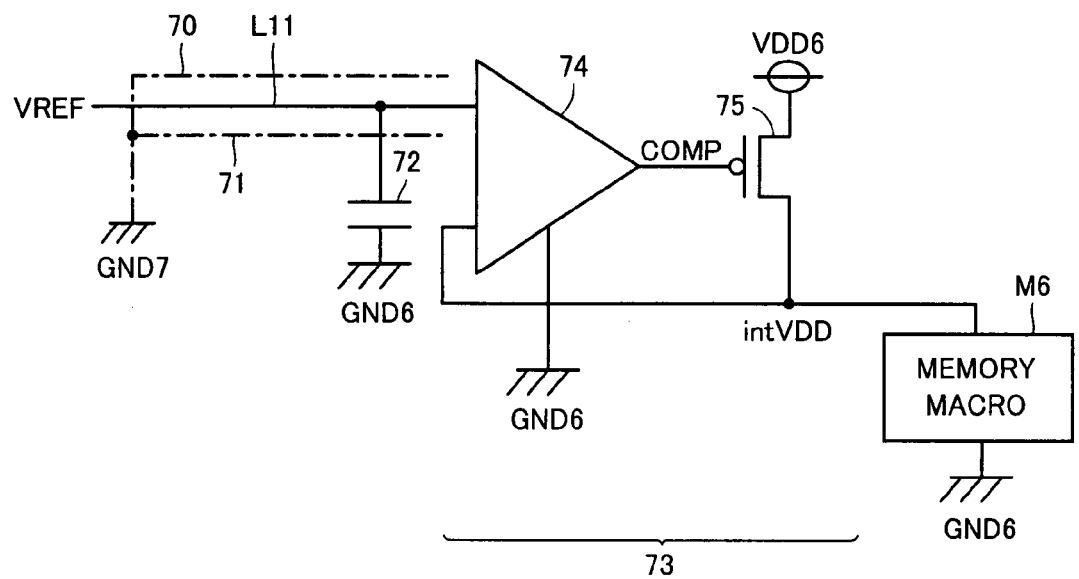
FIG. 20 is a block diagram of a main part of a semiconductor integrated circuit device according to a fourth embodiment of the present invention.
Figure 21:
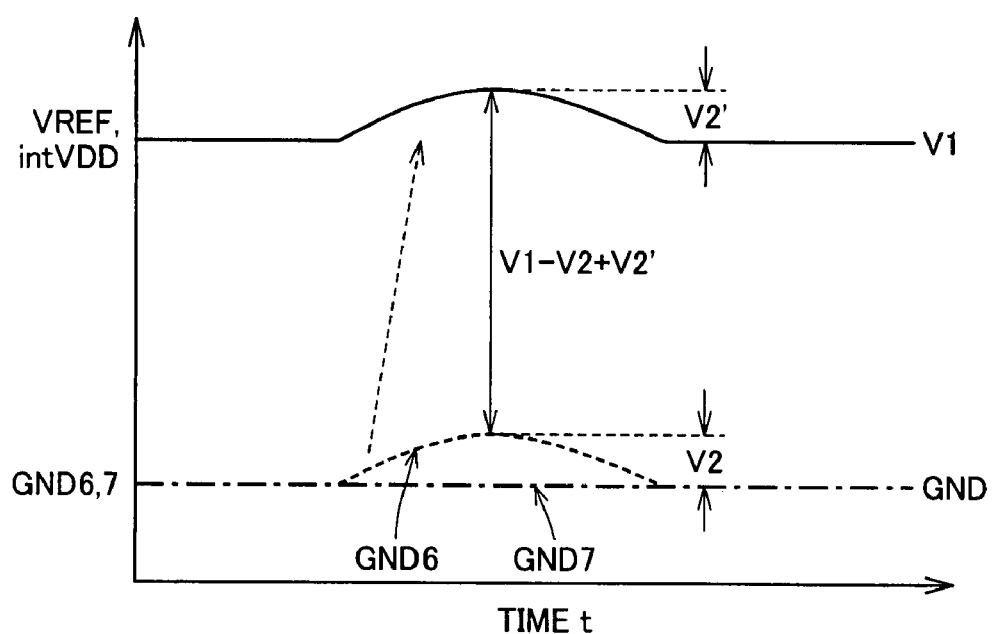
FIG. 21 is a timing chart indicating an operation of the semiconductor integrated circuit device shown in FIG. 20.

In view of this problem, one electrode of stabilization capacitor 72 is connected to the line of ground voltage GND6 for power supply circuit unit P6 and memory macro M6, instead of the line of ground voltage GND7 dedicated to shielding, in the fourth embodiment, as shown in FIG. 20. Accordingly, when ground voltage GND6 rises to GND+V2, reference voltage VREF rises to the level of V1+V2', and internal power supply voltage intVDD also rises to the level of V1+V2', as shown in FIG. 21. Here, V2≈V2' is established since the capacitance of stabilization capacitor 72 is sufficiently larger than the parasitic capacitance of reference voltage line L11. Therefore, even if ground voltage GND6 rises at memory macro M6, drive voltage intVDD–GND6 of memory macro M6 is maintained at substantially V1, so that the operation speed of memory macro M6 will not be degraded.

Fifth Embodiment

Figure 22:
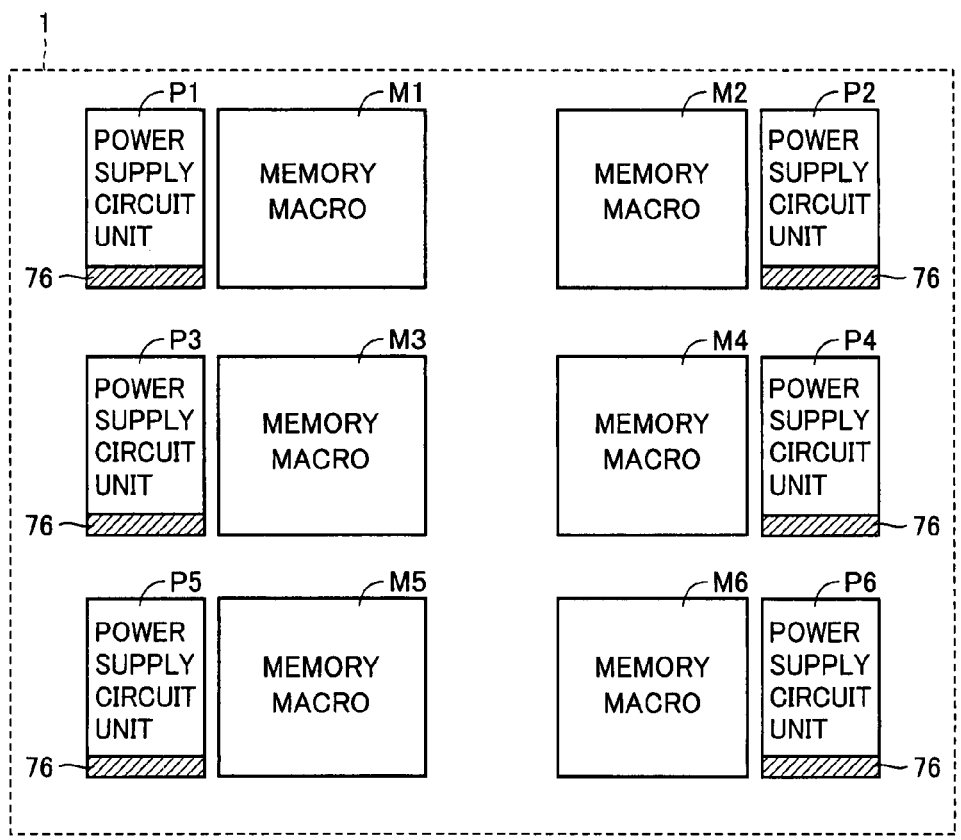
FIG. 22 is a block diagram of a configuration of a semiconductor integrated circuit device according to a fifth embodiment of the present invention.

FIG. 22 is a block diagram of a configuration of a semiconductor integrated circuit device according to a fifth embodiment of the present invention. Referring to FIG. 22, the semiconductor integrated circuit device has a plurality (six in the drawing) of memory macros M1-M6 arranged in three rows and two columns at the surface of semiconductor substrate 1. Power supply circuit units P1-P6 are arranged adjacent to memory macros M1-M6, respectively. A reference voltage generation circuit 76 is arranged at each of power supply circuit units P1-P6. Reference voltage generation circuit 76 of each of power supply circuit units P1-P6 generates a respective one of reference voltages VREF1-VREF6, and supplies the reference voltage to VDC circuit 73, for example, in corresponding power supply circuit units P1-P6.

Figure 23:
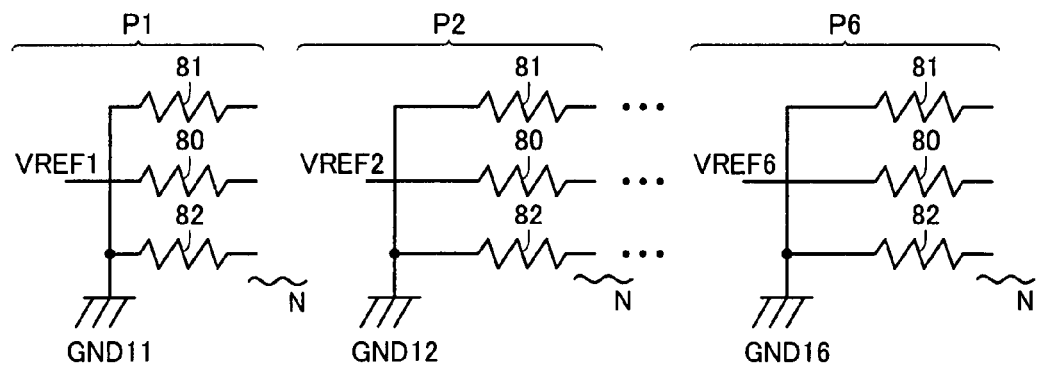
FIG. 23 is a circuit diagram of a reference voltage line and shield line in the semiconductor integrated device shown in FIG. 22.

As shown in FIG. 23, reference power supply lines 80 are provided at power supply circuit units P1-P6 to supply reference voltages VREF1-VREF6, respectively. Also shield lines 81 and 82 are provided so as to sandwich each reference voltage line 80. Ground voltages GND11-GND16 dedicated to shielding are provided to shield lines 81 and 82 of power supply circuit units P1-P6, respectively.

Since reference voltage generation circuit 76, reference voltage line 80, and shield lines 81 and 82 are provided for each of power supply circuit units P1-P6 in the fifth embodiment, the resistance of shield lines 81-82 can be reduced. Therefore, the level of noise N at the lines of ground voltages GND11-GND16 of shield lines 81 and 82 to the farthest point can be suppressed to a low level.

Sixth Embodiment

Figure 24:
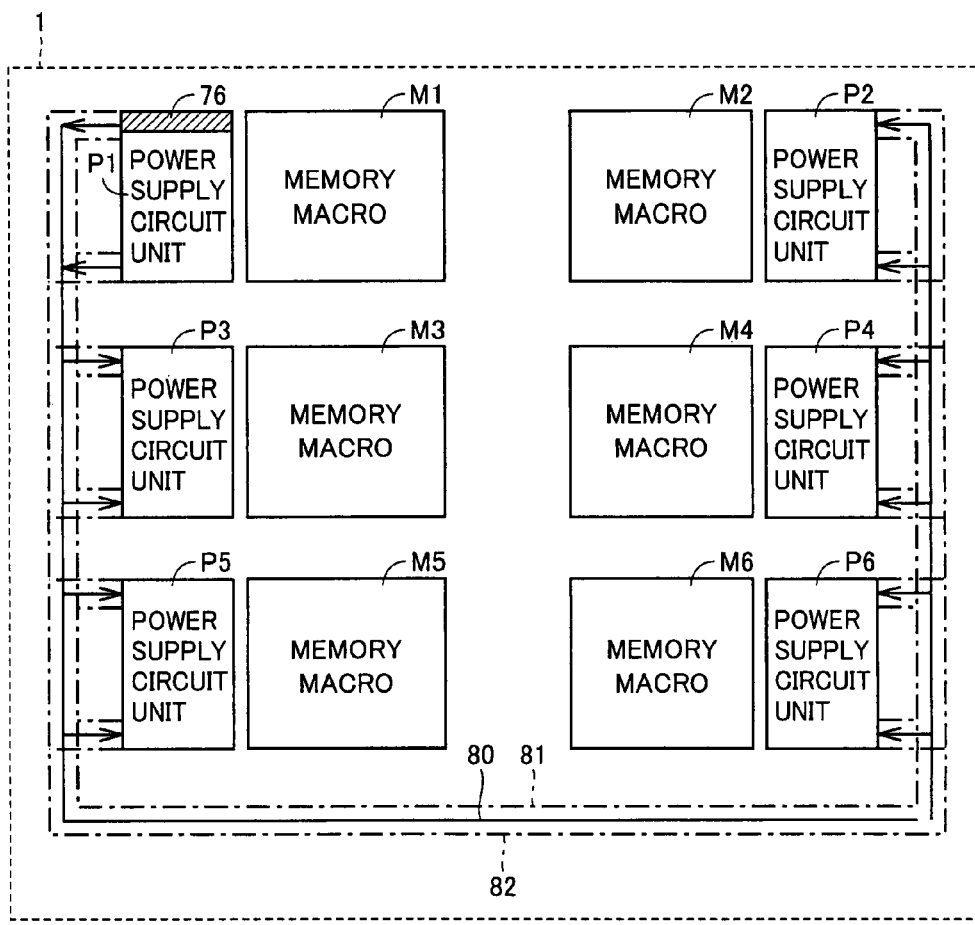
FIG. 24 is a block diagram of a configuration of a semiconductor integrated circuit device according to a sixth embodiment of the present invention.
Figure 25:
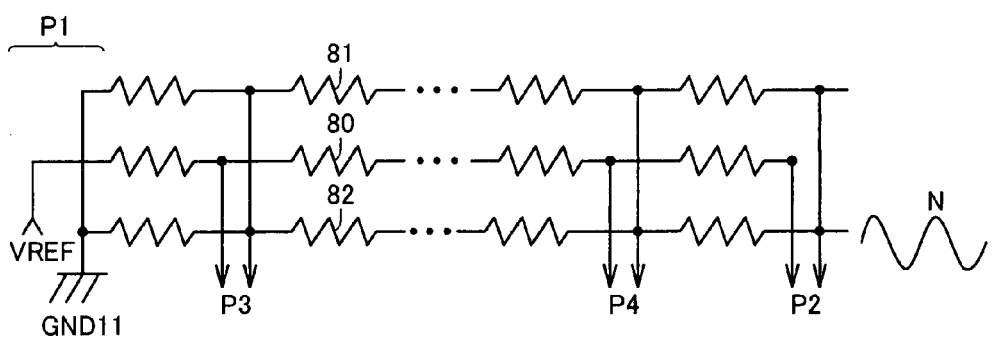
FIG. 25 is a circuit diagram of a reference voltage line and shield line in the semiconductor integrated circuit device shown in FIG. 24.

FIG. 24 is a block diagram of a configuration of a semiconductor integrated circuit device according to a sixth embodiment of the present invention, comparable to FIG. 22. The semiconductor integrated circuit device of FIG. 24 differs from the semiconductor integrated circuit device of FIG. 22 in that reference voltage generation circuit 76 is disposed at only power supply circuit unit P1, and reference voltage VREF generated at reference voltage generation circuit 76 is supplied to all power supply circuit units P1-P6 via reference voltage line 80. Shield lines 81 and 82 are provided so as to sandwich reference voltage line 80. As shown in FIG. 25, ground voltage GND1 dedicated to shielding is applied to shield lines 81 and 82 at power supply circuit unit P1.

Since reference voltage generation circuit 76, reference voltage line 80, and shield lines 81 and 82 are provided common to power supply circuit units P1-P6 in the sixth embodiment, the layout area can be reduced as compared to that of the fourth embodiment.

Figure 26:
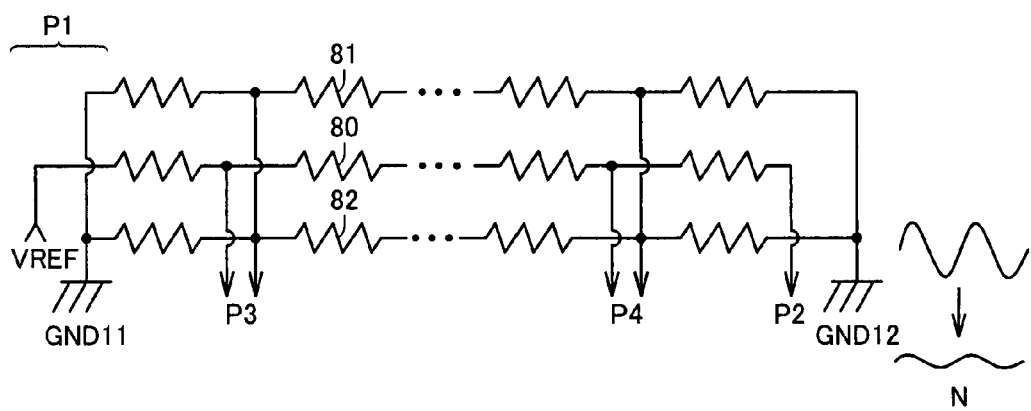
FIG. 26 is a circuit diagram of a modification of the sixth embodiment.
Figure 27:
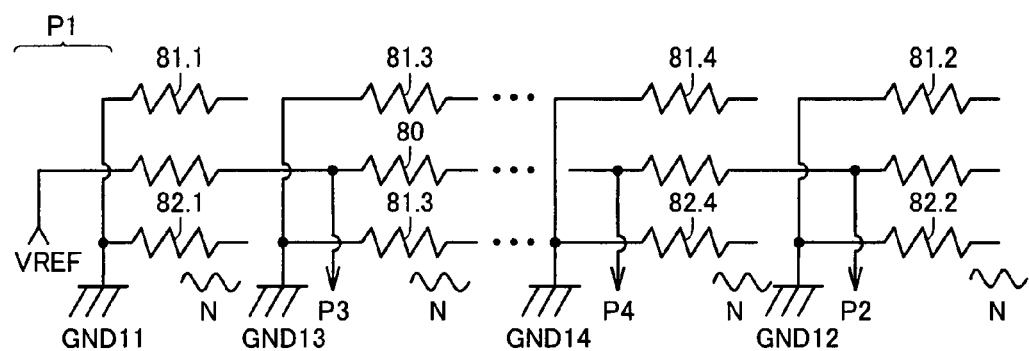
FIG. 27 is a circuit diagram of another modification of the sixth embodiment.

It is to be noted that, when the number of memory macros is increased, the resistance of shield lines 81 and 82 becomes larger, so that noise N of shield lines 81 and 82 from the line of ground voltage GND11 to the farthest point becomes higher. In this case, shield lines 81 and 82 are to be connected at a plurality of sites (two sites in the drawing) to the lines of ground voltages GND11 and GND12 for shielding, as shown in FIG. 26. Further, as shown in FIG. 27, shield lines 81 and 82 can be divided into six sets of shield lines 81.1, 82.1; . . . ; 81.6, 82.6 corresponding to power supply circuit units P1-P6. The six sets of shield lines 81.1, 82.1; . . . ; 81.6, 82.6 may be connected to the lines of ground voltages GND11-GND16, respectively, dedicated to shielding. Accordingly, the level of noise N can be suppressed at a low level.

Seventh Embodiment

Figure 28:
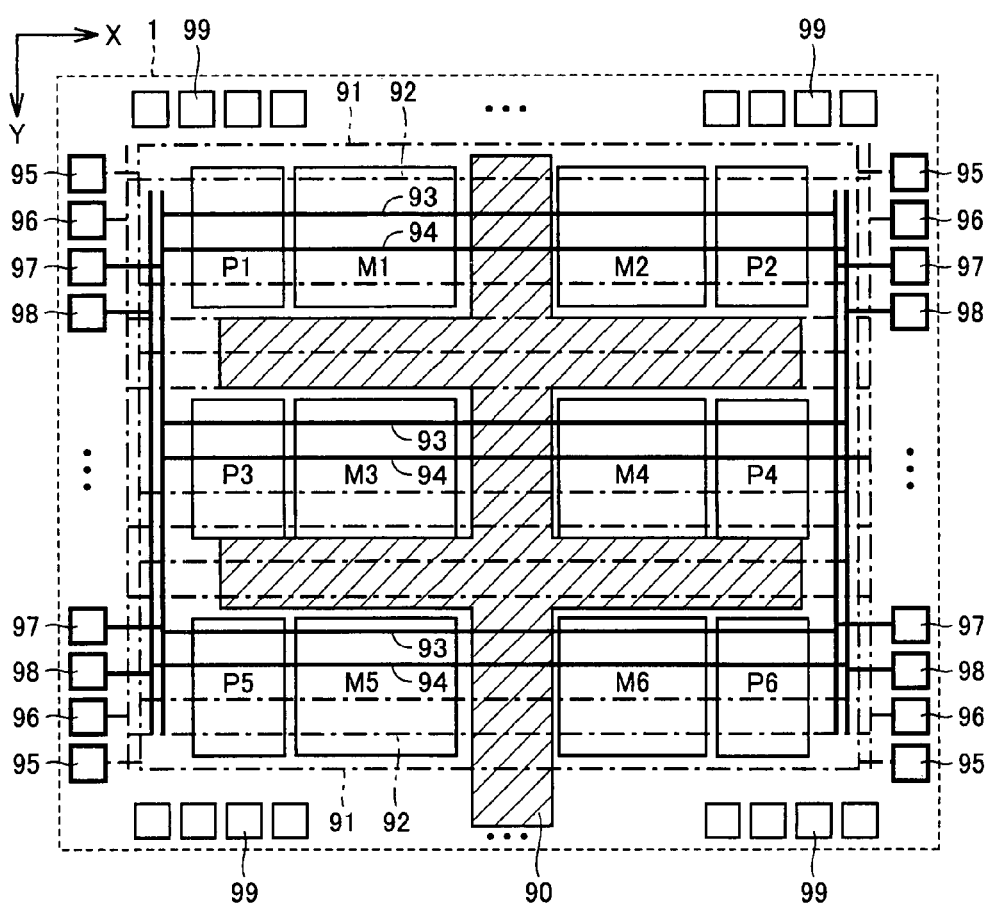
FIG. 28 is a block diagram to describe a problem in this type of semiconductor integrated circuit device.

FIG. 28 is a block diagram of a configuration of this type of semiconductor integrated circuit device. Referring to FIG. 28, the semiconductor integrated circuit device includes a semiconductor substrate 1, six memory macros M1-M6 arranged in three rows and two columns at the surface thereof, power supply circuit units P1-P6 provided adjacent to memory macros M1-M6, respectively, in the X direction, a logic circuit 90 arranged at the region between memory macros M1-M6 and power supply circuit units P1-P6, a plurality of power supply voltage lines 91 for logic, a plurality of ground voltage lines 92 for logic, three power supply voltage lines 93 for memory, three ground voltage lines 94 for memory, a plurality of power supply voltage pads 95 for logic, a plurality of ground voltage pads 96 for logic, a plurality of power supply voltage pads 97 for memory, a plurality of ground voltage pads 98 for memory, and a plurality of signal pads 99.

Each of lines 91-94 extends in the X direction in the drawing. Pads 95-99 are arranged in the Y direction in the drawing at respective ends of substrate 1. Each logic power supply voltage line 91 receives external power supply voltage from logic power supply voltage pad 95, and supplies the received external power supply voltage to logic circuit 90. Each logic ground voltage line 92 receives external ground voltage from logic ground voltage pad 96, and supplies the received external ground voltage to logic circuit 90. The three memory power supply voltage lines 93 receive external power supply voltage from memory power supply voltage pad 97 to supply the received external power supply voltage to the three sets of memory macros, and power supply circuit units M1, P1, M2, P2; M3, P3, M4, P4; M5, P5, M6, P6, respectively. The three memory ground voltage lines 94 receive external ground voltage from memory ground voltage pad 98 to supply the received external ground voltage to the three sets of memory macros and power supply circuit units M1, P1, M2, P2; M3, P3, M4, P4; M5, P5, M6, P6. Signal pad 99 is used to input and/or output a signal between the semiconductor integrated circuit device and an external source.

Since two sets of memory macros and power supply circuit units, i.e. M1, P1, and M2 and P2; M3, P3 and M4, P4; and M5, P5 and M6, P6, share one memory power supply voltage line 93 and one memory ground voltage line 94 in this semiconductor integrated circuit device, the voltage drop at each memory power supply voltage line 93 and the voltage rise at each memory ground voltage line 94 are increased, leading to the problem that the circuit characteristics are degraded.

Figure 29:
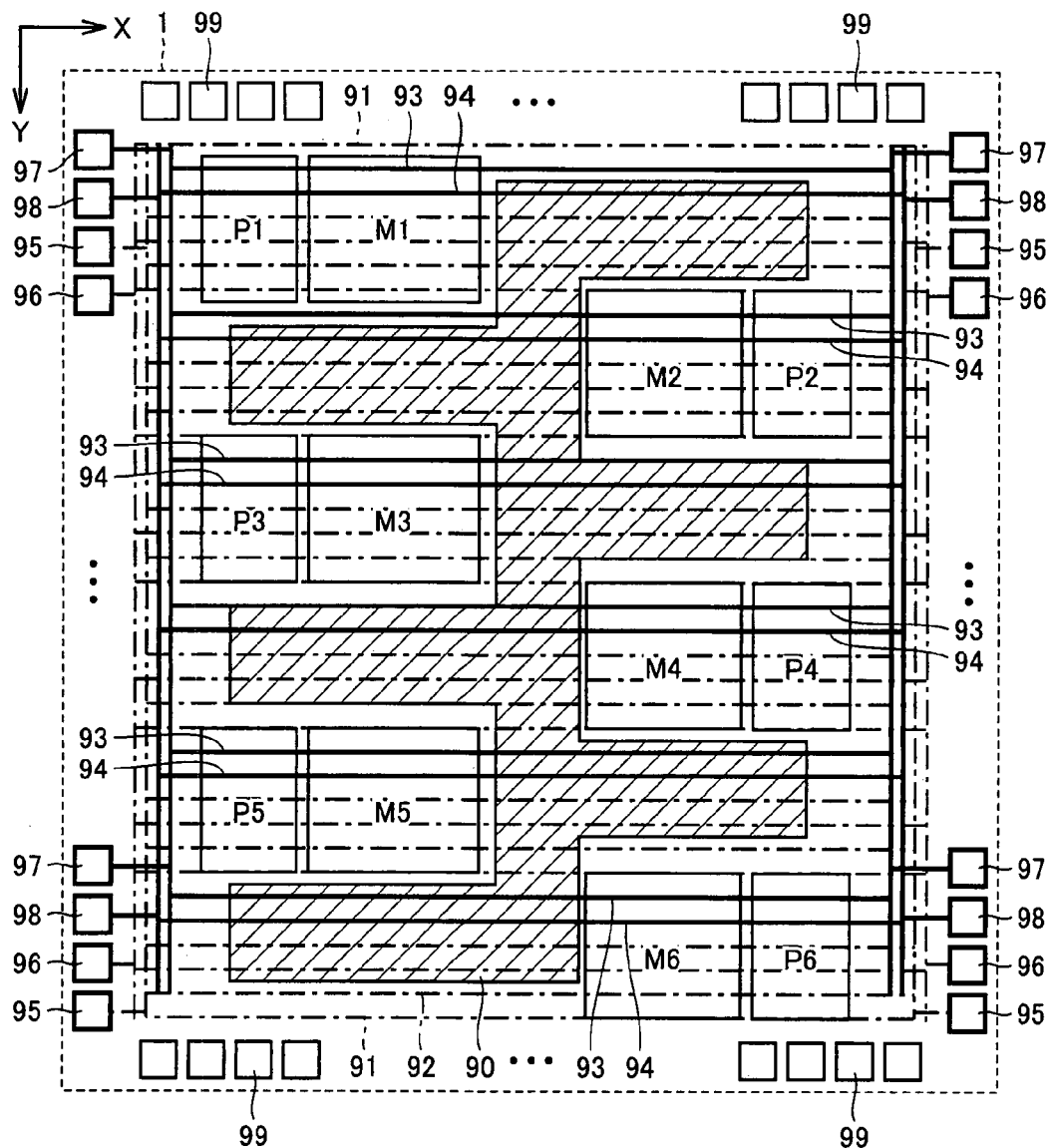
FIG. 29 is a block diagram of a configuration of a semiconductor integrated circuit device according to a seventh embodiment of the present invention.

In view of this problem, the surface of substrate 1 is divided into six regions in the Y direction, as shown in FIG. 29 in the seventh embodiment. At each of the six regions are provided six sets of memory macros and power supply circuit units M1, P1; . . . ; M6, P6. Memory power supply voltage line 93 and memory ground voltage line 94 are provided corresponding to each set of the six memory macros and power supply circuit units M1, P1; . . . ; M6, P6. Accordingly, the voltage drop at each memory power supply voltage line 93 and voltage rise at each memory ground voltage line 94 are reduced in the present semiconductor integrated circuit device, allowing suppression in degradation of the circuit characteristics.

A plurality of the embodiments among the first to seventh embodiments set forth above may be combined appropriately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of negative voltage supply lines connected in common,
   a plurality of negative voltage detection circuits provided corresponding to said plurality of negative voltage supply lines, respectively, each providing a first activation signal when a voltage of a corresponding negative voltage supply line is higher than a predetermined negative voltage,
   a plurality of negative charge supply circuits provided corresponding to said plurality of negative voltage supply lines, respectively, each supplying negative charge to a corresponding negative voltage supply line when said first activation signal is output from a corresponding negative voltage detection circuit,
   a plurality of memory circuits provided corresponding to said plurality of negative voltage supply lines, respectively, each receiving said negative voltage from a corresponding negative voltage supply line, allowing a data write/read operation independently, and
   a control circuit rendering a first number of negative voltage detection circuits active among said plurality of negative voltage detection circuits in an active mode, and rendering a second number of negative voltage detection circuits active in a standby mode, said second number lower than said first number.

2. The semiconductor according to claim 1, further comprising:
   a negative voltage detection circuit for standby, rendered active at least in a standby mode, driven by a drive current lower than the drive current of said negative voltage detection circuit to output a second activation signal when the voltage of said plurality of negative voltage supply lines is higher than said predetermined negative voltage, and
   a negative charge supply circuit for standby, supplying negative charge to said plurality of negative voltage supply lines when said second activation signal is output from said voltage detection circuit for standby,
   wherein said control circuit renders one or more of said plurality of negative voltage detection circuits active in an active mode, and renders said plurality of negative voltage detection circuits inactive in said standby mode.

3. The semiconductor device according to claim 1, further comprising a switch circuit provided between said plurality of negative voltage supply lines for electrically disconnecting each negative voltage supply line from other negative voltage supply lines in said active mode, and connecting in common said plurality of negative voltage supply lines in said standby mode.

* * * * *